US008334819B2

(12) United States Patent
Hillis et al.

(10) Patent No.: US 8,334,819 B2
(45) Date of Patent: *Dec. 18, 2012

(54) SUPERIMPOSED DISPLAYS

(75) Inventors: W. Daniel Hillis, Encino, CA (US); Nathan P. Myhrvold, Medina, WA (US); Clarence T. Tegreene, Bellevue, WA (US); Lowell L. Wood, Jr., Livermore, CA (US)

(73) Assignee: The Invention Science Fund I, LLC, Bellevue, WA (US)

( * ) Notice: Subject to any disclaimer, the term of this patent is extended or adjusted under 35 U.S.C. 154(b) by 591 days.

This patent is subject to a terminal disclaimer.

(21) Appl. No.: 12/583,511

(22) Filed: Aug. 20, 2009

(65) Prior Publication Data

US 2010/0019991 A1      Jan. 28, 2010

Related U.S. Application Data

(63) Continuation-in-part of application No. 11/078,206, filed on Mar. 11, 2005, and a continuation-in-part of application No. 11/447,682, filed on Jun. 5, 2006, and a continuation-in-part of application No. 11/447,611, filed on Jun. 5, 2006, and a continuation-in-part of application No. 11/078,207, filed on Mar. 11, 2005, and a continuation-in-part of application No. 12/215,644, filed on Jun. 27, 2008, and a continuation-in-part of application No. 11/099,409, filed on Apr. 4, 2005, and a continuation-in-part of application No. 11/497,793, filed on Aug. 2, 2006, and a continuation-in-part of application No. 11/113,453, filed on Apr. 22, 2005, now Pat. No. 7,990,349, and a continuation-in-part of application No. 11/449,516, filed on Jun. 7, 2006, and a continuation-in-part of application No. 11/099,682, filed on Apr. 4, 2005, now Pat. No. 7,662,008, and a continuation-in-part of application No. 11/499,247, filed on Aug. 3, 2006, now Pat. No. 7,977,130.

(51) Int. Cl.
    *G09G 5/00* (2006.01)
(52) U.S. Cl. .................................. 345/4; 345/5; 345/6
(58) Field of Classification Search .................. 345/4, 5, 345/6
    See application file for complete search history.

(56) References Cited

U.S. PATENT DOCUMENTS 4,843,191  A    6/1989  Thomas
(Continued)

FOREIGN PATENT DOCUMENTS

JP          59-126967 A      7/1984
(Continued)

OTHER PUBLICATIONS

Agache, Vincent; Quévy, Emmanuel; Collard, Dominique; Buchaillot, Lionel; "Stiction-controlled locking system for three-dimensional self-assembled microstructures: Theory and experimental validation"; Applied Physics Letters; bearing dates of Dec. 3, 2001, Jul. 9, 2001, Sep. 20, 2001, 2001; Jan. 24, 2005; vol. 79, No. 23; pp. 3869-3871; American Institute of Physics.

(Continued)

*Primary Examiner* — Latanya Bibbins

(57) ABSTRACT

Various embodiments of methods and systems for constructing and configuring displays constructed from superimposed display subunits are disclosed. A display may be formed by superimposing two display subunits including multiple display elements or pixels which emit or otherwise modulate light. Display subunits may be optically superimposed with an optical system such that a light emitting element in the first subunit is superimposed with a corresponding light emitting element in the second subunit that emits light in a like wavelength band. A method of producing a display may include superimposing first and second display subunits to form a superimposed display area, controlling the first display subunit to produce a first light pattern; and controlling the second display subunit to produce a second light pattern that when superimposed with the first light pattern produces a desired light pattern.

20 Claims, 18 Drawing Sheets

U.S. PATENT DOCUMENTS

| | | | |
|---|---|---|---|
| 4,911,536 A | 3/1990 | Ditzik |
| 5,032,879 A | 7/1991 | Buchmann et al. |
| 5,093,654 A | 3/1992 | Swift et al. |
| 5,177,628 A | 1/1993 | Moddel |
| 5,289,171 A | 2/1994 | Nire et al. |
| 5,298,892 A | 3/1994 | Shapiro et al. |
| 5,355,577 A | 10/1994 | Cohn |
| 5,371,618 A | 12/1994 | Tai et al. |
| 5,545,291 A | 8/1996 | Smith et al. |
| 5,548,282 A | 8/1996 | Escritt et al. |
| 5,596,434 A | 1/1997 | Walba et al. |
| 5,904,545 A | 5/1999 | Smith et al. |
| 5,917,280 A | 6/1999 | Burrows et al. |
| 6,125,226 A | 9/2000 | Forrest et al. |
| 6,180,239 B1 | 1/2001 | Whitesides et al. |
| 6,232,714 B1 | 5/2001 | Shen et al. |
| 6,243,131 B1 | 6/2001 | Martin |
| 6,274,508 B1 | 8/2001 | Jacobsen et al. |
| 6,274,980 B1 | 8/2001 | Burrows et al. |
| 6,281,038 B1 | 8/2001 | Jacobsen et al. |
| 6,291,266 B1 | 9/2001 | Sayyah |
| 6,291,896 B1 | 9/2001 | Smith |
| 6,316,278 B1 | 11/2001 | Jacobsen et al. |
| 6,420,266 B1 | 7/2002 | Smith et al. |
| 6,462,859 B1 | 10/2002 | Bastiaens et al. |
| 6,479,395 B1 | 11/2002 | Smith et al. |
| 6,498,049 B1 | 12/2002 | Friend et al. |
| 6,503,831 B2 | 1/2003 | Speakman |
| 6,507,989 B1 | 1/2003 | Bowden et al. |
| 6,527,964 B1 | 3/2003 | Smith et al. |
| 6,545,422 B1 | 4/2003 | George et al. |
| 6,555,408 B1 | 4/2003 | Jacobsen et al. |
| 6,566,744 B2 | 5/2003 | Gengel |
| 6,586,763 B2 | 7/2003 | Marks et al. |
| 6,587,083 B1 | 7/2003 | Basturk |
| 6,600,467 B1 | 7/2003 | Webb |
| 6,606,079 B1 | 8/2003 | Smith |
| 6,608,439 B1 | 8/2003 | Sokolik et al. |
| 6,611,237 B2 | 8/2003 | Smith |
| 6,618,115 B1 | 9/2003 | Hiroki |
| 6,621,471 B1 | 9/2003 | Ozaki et al. |
| 6,661,393 B2 | 12/2003 | Tegreene et al. |
| 6,665,044 B1 | 12/2003 | Jacobsen et al. |
| 6,673,398 B2 | 1/2004 | Schneider et al. |
| 6,683,663 B1 | 1/2004 | Hadley et al. |
| 6,693,384 B1 | 2/2004 | Vicentini et al. |
| 6,698,077 B2 | 3/2004 | Buchwalter et al. |
| 6,741,386 B2 | 5/2004 | Minami |
| 6,762,566 B1 | 7/2004 | George et al. |
| 6,780,696 B1 | 8/2004 | Schatz |
| 6,809,196 B2 | 10/2004 | Bamdad et al. |
| 6,850,000 B1 | 2/2005 | Huang et al. |
| 6,861,136 B2 | 3/2005 | Verlinden et al. |
| 6,862,009 B2 | 3/2005 | Park |
| 6,863,402 B2 | 3/2005 | Roddy et al. |
| 6,864,864 B2 | 3/2005 | Lin |
| 6,867,551 B2 | 3/2005 | Okuda |
| 6,927,085 B2 | 8/2005 | Hadley et al. |
| 6,979,380 B2 | 12/2005 | Thorson et al. |
| 6,993,709 B1 | 1/2006 | Lynn et al. |
| 6,998,644 B1 | 2/2006 | Boling et al. |
| 7,016,704 B2 | 3/2006 | Pallakoff |
| 7,046,328 B2 | 5/2006 | Jacobsen et al. |
| 7,061,450 B2 | 6/2006 | Bright et al. |
| 7,101,502 B2 | 9/2006 | Smith et al. |
| 7,129,654 B2 | 10/2006 | Tsai et al. |
| 7,141,176 B1 | 11/2006 | Smith et al. |
| 7,172,789 B2 | 2/2007 | Smith et al. |
| 7,198,411 B2 | 4/2007 | Fujii et al. |
| 7,232,704 B2 | 6/2007 | Singh |
| 7,244,326 B2 | 7/2007 | Craig et al. |
| 7,262,754 B1 | 8/2007 | Yamazaki |
| 7,321,159 B2 | 1/2008 | Schatz |
| 7,662,008 B2 | 2/2010 | Hillis et al. |
| 2002/0027124 A1 | 3/2002 | Bashir et al. |
| 2002/0064909 A1 | 5/2002 | Gracias et al. |
| 2002/0070909 A1 | 6/2002 | Asano et al. |
| 2002/0072074 A1 | 6/2002 | Zhang et al. |
| 2002/0088985 A1 | 7/2002 | Komoto et al. |
| 2002/0158814 A1 | 10/2002 | Bright et al. |
| 2002/0190415 A1 | 12/2002 | Yang et al. |
| 2003/0020757 A1 | 1/2003 | Aratani et al. |
| 2003/0068519 A1 | 4/2003 | Brewer et al. |
| 2003/0100837 A1 | 5/2003 | Lys et al. |
| 2003/0117423 A1 | 6/2003 | Brown Elliott et al. |
| 2003/0158795 A1 | 8/2003 | Markham et al. |
| 2003/0186469 A1 | 10/2003 | Fonstad, Jr. et al. |
| 2004/0020774 A1 | 2/2004 | Aksay et al. |
| 2004/0023414 A1 | 2/2004 | Zhang et al. |
| 2004/0150584 A1 | 8/2004 | Chuman et al. |
| 2004/0179145 A1 | 9/2004 | Jacobsen et al. |
| 2004/0227140 A1 | 11/2004 | Lee et al. |
| 2004/0241381 A1 | 12/2004 | Chen |
| 2005/0000634 A1 | 1/2005 | Craig et al. |
| 2005/0114902 A1 | 5/2005 | Choi |
| 2005/0196589 A1 | 9/2005 | Watanabe |
| 2006/0057293 A1 | 3/2006 | Sharma et al. |
| 2006/0132477 A1 | 6/2006 | Kerr et al. |

FOREIGN PATENT DOCUMENTS

| | | |
|---|---|---|
| WO | WO 96/19792 | 6/1996 |

OTHER PUBLICATIONS

Aizenberg, Joanna; Black, Andrew J.; Whitesides, George M.; "Control of crystal nucleation by patterned self-assembled monolayers"; Nature: letters to nature; Apr. 8, 1999; vol. 398; pp. 495-498; Macmillan Magazines Ltd.

Bowden, Ned; Choi, Insung S.; Grzybowski, Bartosz A.; Whitesides, George M.; "Mesoscale Self-Assembly of Hexagonal Plates Using Lateral Capillary Forces: Synthesis Using the "Capillary Bond""; J. Am. Chem. Soc.; bearing dates of Nov. 9, 1998, Mar. 5, 1999, May 27, 1999; pp. 5373-5391; American Chemical Society.

Breen, Tricia L.; Tien, Joe; Oliver, Scott R. J.; Hadzic, Tanja; Whitesides, George M.; "Design and Self-Assembly of Open, Regular, 3D Mesostructures"; Science; May 7, 1999; vol. 284; pp. 948-951; located at: www.sciencemag.org.

Bruzzone, Charles L.; Ma, James (Jiaying); Aastuen, David J.W.; Eckhardt, Stephen K.; "10.4: High Performance LCoS Optical Engine Using Cartesian Polarizer Technology"; SID (Society for Information Display) Symposium Digest of Technical Papers; May 2003; pp. 126-129; vol. 34, Issue 1; 3M Optical Systems Division, St. Paul, MN, USA; supplied from http://cms.3m.com/cms/US/en/2-136/kirluFW/view.jhtml; pp. 1-4.

Chung, Sung-Wook; Ginger, David S.; Morales, Mark W.; Zhang, Zhengfan; Chandrasekhar, Venkat; Ratner, Mark A.; Mirkin, Chad A.; "Top-Down Meets Bottom-Up: Dip-Pen Nanolithography and DNA-Directed Assembly of Nanoscale Electrical Circuits"; SMALL; bearing dates of May 27, 2004, 2005; No. 1; pp. 2-7; Wiley-VCH Verlag GmbH & Co. KGaA; located at: www.small-journal.com.

"DNA self-assembly used to mass-produce patterned nanostructures"; Nanotechnology; Dec. 23, 2005; pp. 1-6; Physorg.com; located at http://www.physorg.com/news9322.html; printed on Feb. 16, 2006.

"Foled® Flexible OLEDs"; Universal Display: FOLED Technology; pp. 1-3; Universal Display Corporation; bearing dates of May 2001; located at: http://www.universaldisplay.com/foled.htm#substrates; printed on Mar. 22, 2005.

"Forming Photonic Crystal Patterns From Hydrogel Nanoparticles"; Spacedaily: Your Portal to Space; Sep. 11, 2003; pp. 1-5; located at: http://www.spacedaily.com/news/nanotech-03zs.html; printed on Mar. 9, 2005.

Freitas Jr., Robert A.; "The Future of Nanofabrication and Molecular Scale Devices in Nanomedicine"; Nanomedicine Book Chapter—MIT-OIS—2001; bearing dates of Jul. 2002, 2001; pp. 1-17; Zyvex Corp.; located at: http://www.rfreitas.com/Nano/FutureNanofabNMed.htm; printed on Mar. 9, 2005.

Goodman, R.P.; Schaap, I.A.T.; Tardin, C.F.; Erben, C.M.; Berry, R.M.; Schmidt, C.F.; Turberfield, A.J.; "Rapid Chiral Assembly of Rigid DNA Building Blocks for Molecular Nanofabrication"; Science; Bearing a date of Dec. 9, 2005; pp. 1661-1665; vol. 310; located at www.sciencemag.org.

Gracias, David H.; Tien, Joe; Breen, Tricia L.; Hsu, Carey; Whitesides, George M.; "Forming Electrical Networks in Three Dimensions by Self-Assembly"; Science; Aug. 18, 2000; vol. 289; pp. 1170-1172; located at: www.sciencemag.org.

Grzybowski, Bartosz A.; Bowden, Ned; Arias, Francisco; Yang, Hong; Whtesides, George M.; "Modeling of Menisci and Capillary Forces from the Millimeter to the Micrometer Size Range"; J. Phys. Chem. B; bearing dates of Jul. 24, 2000, Oct. 25, 2000, Dec. 19, 2000, 2001; vol. 105; pp. 404-412; American Chemical Society.

Jakab, Karoly; Neagu, Adrian; Mironov, Vladimir; Markwald, Roger R.; Forgacs, Gabor; "Engineering biological structures of prescribed shape using self-assembling multicellular systems"; PNAS; bearing dates of Mar. 2, 2004, Jan. 8, 2004, 2004, Jul. 20, 2003; vol. 101, No. 9; pp. 2864-2869; located at: www.pnas.org/cgi/doi/10.1073/pnas.0400164101.

"LED Panels—Technical Details"; SuperSCREEN.com; pp. 1-2; located at http://www.superscreen.com/led/en/20mm_panel.php?navid=15; printed on Mar. 31, 2005.

Licata, Nicholas A.; Tkachenko, Alexei V.; "Error-proof self-assembly of DNA-nanoparticle clusters"; pp. 1-5; located at http://xxx.lanl.gov/PD_cache/cond-mat/pdf/0504/0504407.pdf; programmable bearing a date of Apr. 16, 2005; Department of Physics; University of Michigan; Ann Arbor; Michigan.

Montemagno, Carlo; Bachand, George; "Constructing nanomechanical devices powered by biomolecular motors"; Nanotechnology; bearing dates of Jan. 21, 1999, 1999; vol. 10; pp. 225-231;(+ duplicate Nanotech cover page and duplicate pp. 226, 228, 229, 230, for sake of clarity); IOP Publishing Ltd.

Redl, F.X.; Cho, K.-S.; Murray, C.B., O'Brien, S.; "Three-dimensional binary superlattices of magnetic nanocrystals and semiconductor quantum dots"; Nature; Jun. 26, 2003; bearing a date of 2003; vol. 423; pp. 968-971; Nature Publishing Group.

Segelken, Roger; "First Biomolecular Motors with Metal Propellers are Reported by Cornell Nanobiotechnologists"; NanoMeter; Spring 2001; vol. 12, No. 1; pp. 1-8; Cornell Nanofabrication Facility.

Srinivasan, Uthara; Liepmann, Dorian; Howe, Roger T.—*Fellow, IEEE*; "Microstructure to Substrate Self-Assembly Using Capillary Forces"; Journal of Microelectromechanical Systems; bearing dates of Jul. 21, 2000, Oct. 15, 2000, Mar. 2001; vol. 10, No. 1; pp. 17-24; IEEE.

Tien, Joe; Terfort, Andreas; Whitesides, George M.; "Microfabrication through Electrostatic Self-Assembly"; Langmuir; bearing dates of May 2, 1997, Jul. 29, 1997, 1997; vol. 13; pp. 5349-5355; American Chemical Society.

Whitesides, George M.; Grzybowski, Bartosz; "Self-Assembly at All Scales"; Science; Mar. 29, 2002; vol. 295; pp. 2418-2421; located at: www.sciencemag.org;.

Xiong, Xiaorong; Hanein, Yael—*Member, IEEE*; Fang, Jiandong; Wang, Yanbing; Wang, Weihua; Schwartz, Daniel T.; Böhringer, Karl F.—*Member, IEEE*; "Controlled Multibatch Self-Assembly of Microdevices"; Journal of Microelectromechanical Systems; bearing dates of Apr. 2003, 2003; vol. 12, No. 2; pp. 117-127, Errata; IEEE.

Zheng, Wei; Buhlmann, Philippe; Jacobs, Heiko O.; "Sequential shape and-solder-directed self-assembly of functional microsystems"; PNAS; bearing dates of Jul. 23, 2004, Jun. 21, 2004, Aug. 31, 2004; vol. 101, No. 35; pp. 12814-12817; The National Academy of Sciences of the USA; located at: www.pnas.org/cgi/doi/10.1073/pnas.0404437101.

SUPERIMPOSED DISPLAYS

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)). All subject matter of the Related Applications and of any and all parent, grandparent, great-grandparent, etc. applications of the Related Applications is incorporated herein by reference to the extent such subject matter is not inconsistent herewith.

Related Applications:

For purposes of the USPTO extra-statutory requirements, the present application constitutes a continuation-in-part of U.S. patent application Ser. No. 11/078,206, entitled SELF ASSEMBLY OF ELEMENTS FOR DISPLAYS, naming W. DANIEL HILLIS, NATHAN P. MYHRVOLD, CLARENCE T. TEGREENE, LOWELL L. WOOD, JR., AND VICTORIA Y. H. WOOD as inventors, filed 11 Mar. 2005, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 11/447,682, entitled SELF ASSEMBLY OF ELEMENTS FOR DISPLAYS, naming W. DANIEL HILLIS, NATHAN P. MYHRVOLD, CLARENCE T. TEGREENE, LOWELL L. WOOD, JR., AND VICTORIA Y. H. WOOD as inventors, filed 5 Jun. 2006, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 11/447,611, entitled SELF ASSEMBLY OF ELEMENTS FOR DISPLAYS, naming W. DANIEL HILLIS, NATHAN P. MYHRVOLD, CLARENCE T. TEGREENE, LOWELL L. WOOD, JR., AND VICTORIA Y. H. WOOD as inventors, filed 5 Jun. 2006, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 11/078,207, entitled ELEMENTS FOR SELF-ASSEMBLING DISPLAYS, naming W. DANIEL HILLIS, NATHAN P. MYHRVOLD, CLARENCE T. TEGREENE, LOWELL L. WOOD, JR., AND VICTORIA Y. H. WOOD as inventors, filed 11 Mar. 2005, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 12/215,644, entitled ELEMENTS FOR SELF-ASSEMBLING DISPLAYS, naming W. DANIEL HILLIS, NATHAN P. MYHRVOLD, CLARENCE T. TEGREENE, LOWELL L. WOOD, JR., AND VICTORIA Y. H. WOOD as inventors, filed 27 Jun. 2008, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 11/099,409, entitled SELF ASSEMBLING DISPLAY WITH SUBSTRATE, naming W. DANIEL HILLIS, NATHAN P. MYHRVOLD, CLARENCE T. TEGREENE, LOWELL L. WOOD, JR., AND VICTORIA Y. H. WOOD as inventors, filed 4 Apr. 2005, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 11/497,793, entitled SELF ASSEMBLING DISPLAY WITH SUBSTRATE, naming W. DANIEL HILLIS, NATHAN P. MYHRVOLD, CLARENCE T. TEGREENE; LOWELL L. WOOD, JR., AND VICTORIA Y. H. WOOD as inventors, filed 2 Aug. 2006, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 11/113,453, entitled SUPERIMPOSED DISPLAYS, naming W. DANIEL HILLIS, NATHAN P. MYHRVOLD, CLARENCE T. TEGREENE, AND LOWELL L. WOOD, JR. as inventors, filed 22 Apr. 2005 now U.S. Pat. No. 7,990,349, which is currently, or is an application of which a currently application is entitled to the benefit of the filing date.

For purposes of the USPTO extra-statutory requirements, the present application constitutes a continuation-in-part of U.S. patent application Ser. No. 11/449,516, entitled SUPERIMPOSED DISPLAYS, naming W. DANIEL HILLIS, NATHAN P. MYHRVOLD, CLARENCE T. TEGREENE, AND LOWELL L. WOOD, JR. as inventors, filed 7 Jun. 2006, which is currently co-pending, or is an application of which a currently co-pending application is entitled to the benefit of the filing date.

For purposes of the USPTO extra-statutory requirements, the present application constitutes a continuation-in-part of U.S. patent application Ser. No. 11/099,682, entitled METHOD OF ASSEMBLING DISPLAYS ON SUBSTRATES, naming W. DANIEL HILLIS, NATHAN P. MYHRVOLD, CLARENCE T. TEGREENE, LOWELL L. WOOD, JR., AND VICTORIA Y. H. WOOD as inventors, filed 4 Apr. 2005 now U.S. Pat. No. 7,662,008, which is currently, or is an application of which a currently application is entitled to the benefit of the filing date.

For purposes of the USPTO extra-statutory requirements, the present application constitutes a continuation-in-part of U.S. patent application Ser. No. 11/499,247, entitled METHOD OF ASSEMBLING DISPLAYS ON SUBSTRATES, naming W. DANIEL HILLIS, NATHAN P. MYHRVOLD, CLARENCE T. TEGREENE, LOWELL L. WOOD, JR., AND VICTORIA Y. H. WOOD as inventors, filed 3 Aug. 2006 now U.S. Pat. No. 7,977,130, which is currently, or is an application of which a currently application is entitled to the benefit of the filing date.

The United States Patent Office (USPTO) has published a notice to the effect that the USPTO's computer programs require that patent applicants reference both a serial number and indicate whether an application is a continuation or continuation-in-part. Stephen G. Kunin, Benefit of Prior-Filed Application, USPTO Official Gazette Mar. 18, 2003, available at http://www.uspto.gov/web/offices/com/sol/og/2003/week11/patbene.htm. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant is designating the present application as a continuation-in-part of its parent applications as set forth above, but expressly points out that such designations are not to be construed in any way as any type of commentary and/or admission as to whether or not the present application contains any new matter in addition to the matter of its parent application(s).

TECHNICAL FIELD

The present application relates, in general, to the field of displays, and particularly to methods of manufacture thereof.

BACKGROUND

Displays used in television screens, computer monitors, electronic signs or displays, and the like may be formed from arrays of large numbers of light emitting elements that may be controlled to display time-varying patterns of light. Color displays typically include light emitting elements that emit light of several colors.

SUMMARY

Embodiments of methods and systems for constructing and configuring displays including superimposed display elements are disclosed herein. Features of various embodiments will be apparent from the following detailed description and associated drawings.

BRIEF DESCRIPTION OF THE FIGURES

Features of the invention are set forth in the appended claims. The exemplary embodiments may best be understood by making reference to the following description taken in conjunction with the accompanying drawings. In the figures, like referenced numerals identify like elements.

DETAILED DESCRIPTION

In the following detailed description, reference is made to the accompanying drawings, which form a part hereof. The detailed description and the drawings illustrate specific exemplary embodiments by which the invention may be practiced. These embodiments are described in sufficient detail to enable those skilled in the art to practice the invention. It is understood that other embodiments may be utilized, and other changes may be made, without departing from the spirit or scope of the present invention. The following detailed description is therefore not to be taken in a limiting sense, and the scope of the present invention is defined by the appended claims.

Throughout the specification and claims, the following terms take the meanings explicitly associated herein unless the context dictates otherwise. The meaning of "a", "an", and "the" include plural references. The meaning of "in" includes "in" and "on." A reference to the singular includes a reference to the plural unless otherwise stated or inconsistent with the disclosure herein.

Figure 1:
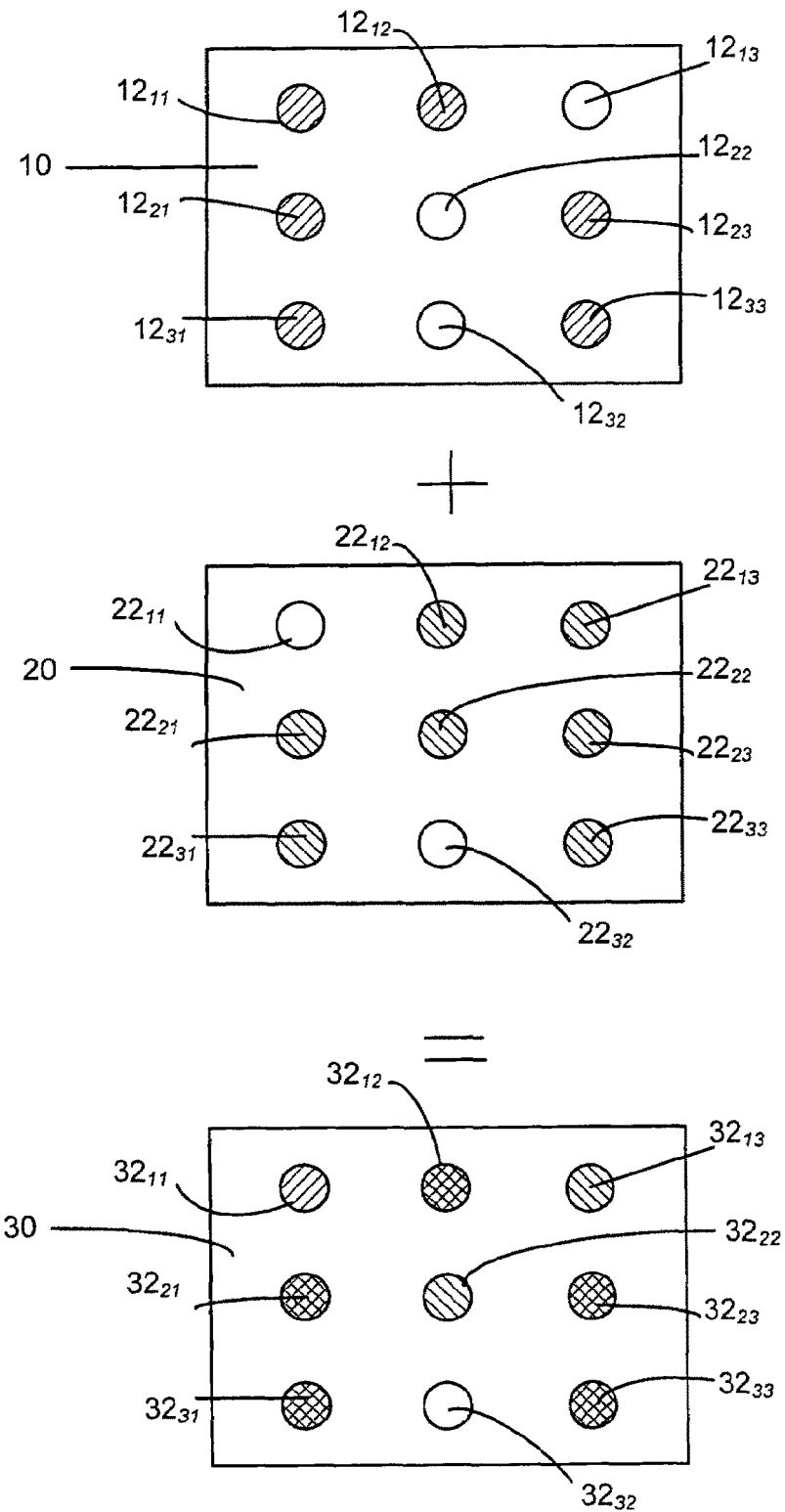
FIG. 1 illustrates superposition of two display subunits to form a superimposed display.

According to one exemplary embodiment, a display is formed by superimposing two display subunits. Each display subunit may include multiple display elements or pixels which emit or otherwise modulate light to produce a visually detectable pattern. FIG. 1 illustrates in schematic form the superposition of a first display subunit 10 including display elements $12_{rc}$ (where row r=1 ... 3 and column c=1 ... 3) with a second display subunit 20 including display elements $22_{rc}$ (where row r=1 ... 3, and column c=1 ... 3) to form a superimposed display 30. Superimposed display 30 includes superimposed display elements $32_{rc}$ (where row r=1 ... 3, and column c=1 ... 3). Each superimposed display element $32_{rc}$ is formed from the superposition of a display element $12_{rc}$ from the first display subunit 10 and a display element $22_{rc}$ from second display subunit 20. For example, superimposed display element $32_{23}$ is formed from the superposition of display elements $12_{23}$ and $22_{23}$. Superimposed display element $32_{23}$ produces light modulation equal to the combined light modulation of the two superimposed display elements $12_{23}$ and $22_{23}$, from first display subunit 10 and second display subunit 20, respectively.

In the example depicted in FIG. 1, in first display subunit 10, display elements $12_{11}$, $12_{12}$, $12_{21}$, $12_{23}$, $12_{31}$, and $12_{33}$, are functional and display elements $12_{13}$, $12_{22}$, and $12_{32}$ are non-functional. In second display subunit 20, display elements $22_{12}$, $22_{13}$, $22_{21}$, $22_{22}$, $22_{23}$, $22_{31}$, and $22_{33}$ are functional and display elements $22_{11}$, and $22_{32}$ are non-functional. In superimposed display 30, superimposed display elements $32_{12}$, $32_{21}$, $32_{23}$, $32_{31}$, and $32_{33}$, are formed from the superposition of two functional display elements. Assuming each functioning display element delivers light with a fluence of about X, then superimposed display elements $32_{12}$, $32_{21}$, $32_{23}$, $32_{31}$, and $32_{33}$, deliver light with a fluence of about 2X. Superimposed display element $32_{32}$ is formed from superposition of non-functional display element $12_{32}$ in first display subunit 10 and non-functional display element $22_{32}$ in second display subunit 20. Assuming each non-functioning display element does not produce any light (or has a fluence of 0), then superimposed display element $32_{32}$ also provides zero fluence and is non-functional. Superimposed display element $32_{11}$ is formed from the superposition of a functional display element $12_{11}$ from first display subunit 10 and a non-functional display element $22_{11}$ from second display subunit 20. Similarly, superimposed display elements $32_{13}$ and $32_{22}$ are formed from the superposition of non-functional display elements $12_{13}$ and $12_{22}$ from first display subunit 10 and functional display elements $22_{13}$ and $22_{22}$, respectively, from second display subunit 20. Superimposed display elements $32_{13}$ and $32_{22}$ may operate at a fluence of about 1X, approximately half-power relative to superimposed display elements that are formed from superposition of two functional display elements.

Display elements may be considered bad, faulty, or non-functional if they are partially or fully non-functional, functional but not connected properly, or not positioned properly. Display elements may also be considered non-functional for non-defective reasons, such as design or operational considerations. For example, display elements may be outside of a desired wavelength range, in a location where light emission or control is not desired, in a location where drawing energy (e.g., from a row driver) is inappropriate, or other considerations in which a non-functional element may be imposed or desired.

FIG. 1 depicts a case in which some superimposed display elements are 'on' or operating at full power, while some superimposed display elements are completely non-functional. Some superimposed display elements (i.e. $32_{11}$, $32_{13}$, and $32_{22}$) are partially functional. In some applications, partial functionality (e.g., operation at about half fluence) would be acceptable performance for a display element, while in other applications, the fluence provided by a partially functional display element would be insufficient. In general, a display element may be deemed 'bad' if its performance falls outside a specified range, which may vary depending on the intended application of the display.

Figure 2:
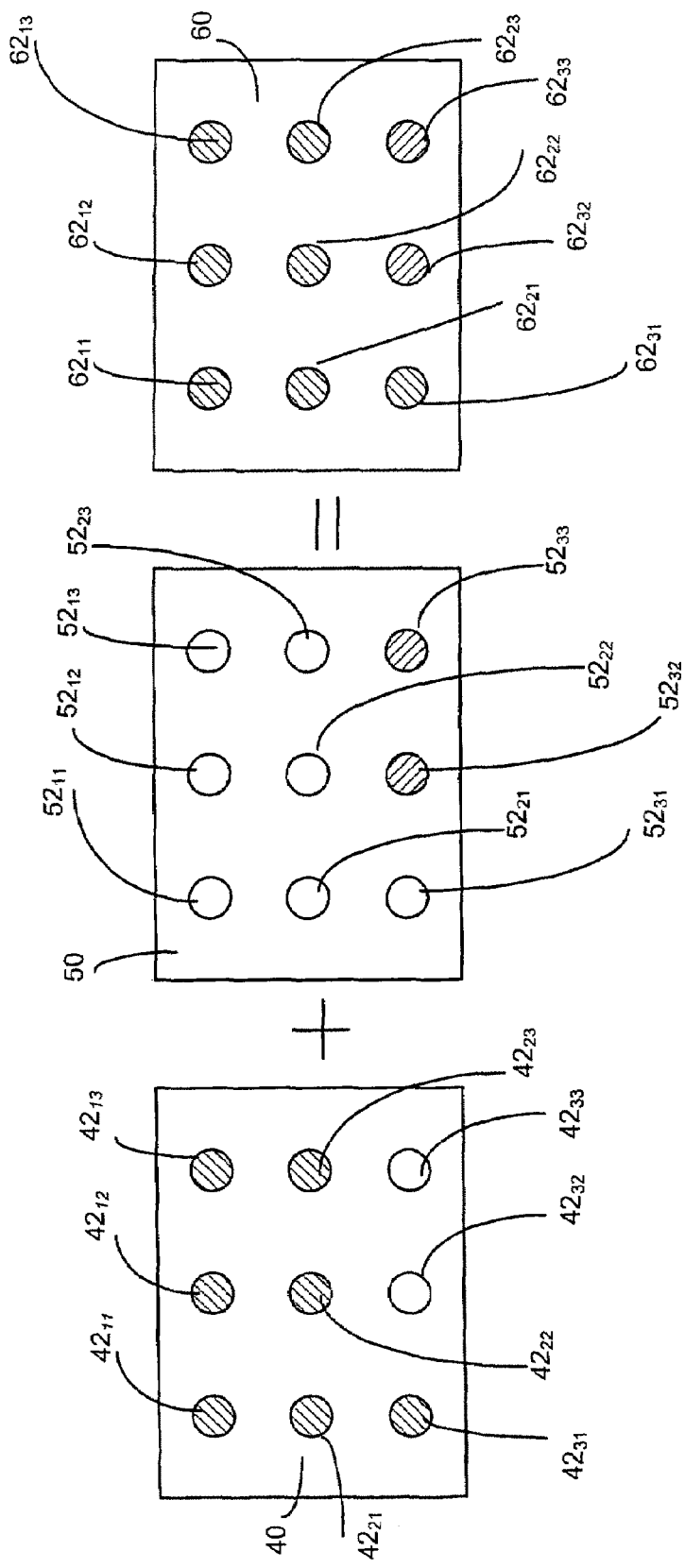
FIG. 2 illustrates superposition of two display subunits with complementary activation patterns.

In some cases it may be desirable to detect bad or non-functional display elements and to configure superimposed display elements to compensate for the non-functional display elements. FIG. 2 depicts a general scheme for compensating for non-functional display elements. In FIG. 2, a first display subunit 40 is provided in which display elements $42_{32}$ and $42_{33}$ are non-functional. Second display subunit 50 may be provided to supplement operation of the non-functional display elements in first display subunit 40. In this example, second display subunit 50 may configured with display elements $52_{32}$ and $52_{33}$ functional (or active) and display elements $52_{11}$, $52_{12}$, $52_{13}$, $52_{21}$, $52_{22}$, $52_{23}$, and $52_{31}$ non-functional (or inactive) so that superposition of first display subunit 40 and second display subunit 50 produces superimposed display 60 in which all display elements $62_{rc}$ are functional with the substantially the same intensity or dynamic range.

Non-functional display elements in a display subunit may be detected by various methods, during and/or subsequent to the manufacture of a superimposed display element array. For example, a CCD camera may be used to detect activation of display elements. Display elements may be activated in a specified pattern, and differences between the detected pattern and the specified pattern pixels may indicated non-functional display elements. Activation of display elements may occur sequentially, simultaneously, or in any other pattern that is convenient for the particular display being tested. Different elements may be differentiated by time sequential activation and detection, color specific activation and detection, and so forth. Activation of display elements may be determined by any signal that correlates with display element activation. For example, electrical correlates such as voltage drop or current may be measured in order to determine activation of display elements. Detection of electrical correlates may be performed with circuitry built into the display subunit or by separate test equipment. In another approach for detecting and compensating for bad display elements, display elements may be activated at a prescribed output intensity and color (e.g., white at a given temperature and intensity). Deviations between the prescribed output and the measured output may be determined, and drive levels for display elements optimized to compensate for element variations. Compensation may be provided for variation in element performance, not limited to defects.

Figure 3:
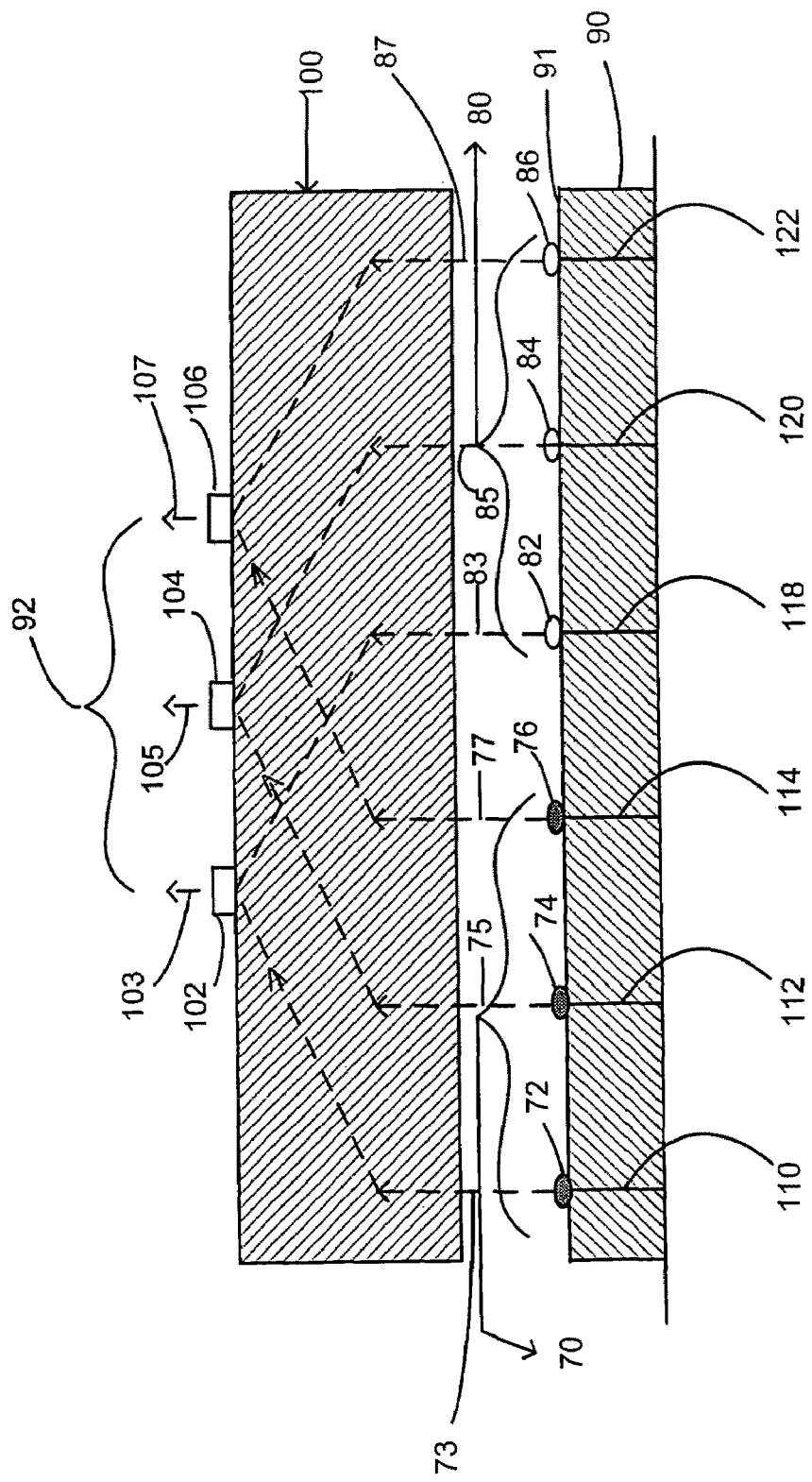
FIG. 3 depicts optical superposition of display subunits formed on the same substrate.

FIG. 3 illustrates an embodiment in which two display subunits 70 and 80 are formed on a single substrate 90. In this exemplary embodiment, first display subunit 70, made up of display elements 72, 74, and 76, and second display subunit 80 made up of display elements 82, 84, and 86, are formed in the same plane, on face 91 of substrate 90. In related embodiments, first and second display subunits may be formed in different layers, levels, or surfaces of substrates. While in some embodiments layers, levels, or surfaces containing display subunits may be planar or substantially planar, subunits may be formed in non-planar layers, levels, or surfaces in other embodiments. Optical system 100 receives optical signals (i.e. light) from first display subunit 70 and second display subunit 80 and combines them optically to form superimposed display 92, which includes superimposed display elements 102, 104, and 106. Optical system 100 takes optical signal 73 from display element 72 and combines it with optical signal 83 from display element 82 to form optical signal 103. Optical system 100 and optical systems used in related embodiments may include one or more lenses, lenslets, reflectors, diffractive elements, combiners, polarization selective elements, or waveguides. Structures such as an X-cube color combiner (e.g., as described by Brozzone et al, SID Symposium Digest of Technical Papers, May 2003, Vol. 34, Issue 1, pp. 126-129), may be used in certain embodiments to optically superimpose display elements. The location at which optical signal 103 is emitted from optical system 100 functions as display element 102 of superimposed display 92. Similarly, optical system 100 takes optical signal 75 from display element 74 and combines it with optical signal 85 from display element 84 to form optical signal 105, and takes optical signal 77 from display element 76 and combines it with optical signal 87 from display element 86 to form optical signal 107. Optical signal 105 and 107 are emitted by superimposed display elements 104 and 106, respectively. Substrate 90 may also include control lines 110, 112, and 114 for driving activation of display elements 72, 74, and 76, respectively, in first display subunit 70, and control lines 118, 120, and 122 for driving activation of display elements 82, 84, and 86, respectively, in second display subunit 80.

Figure 4:
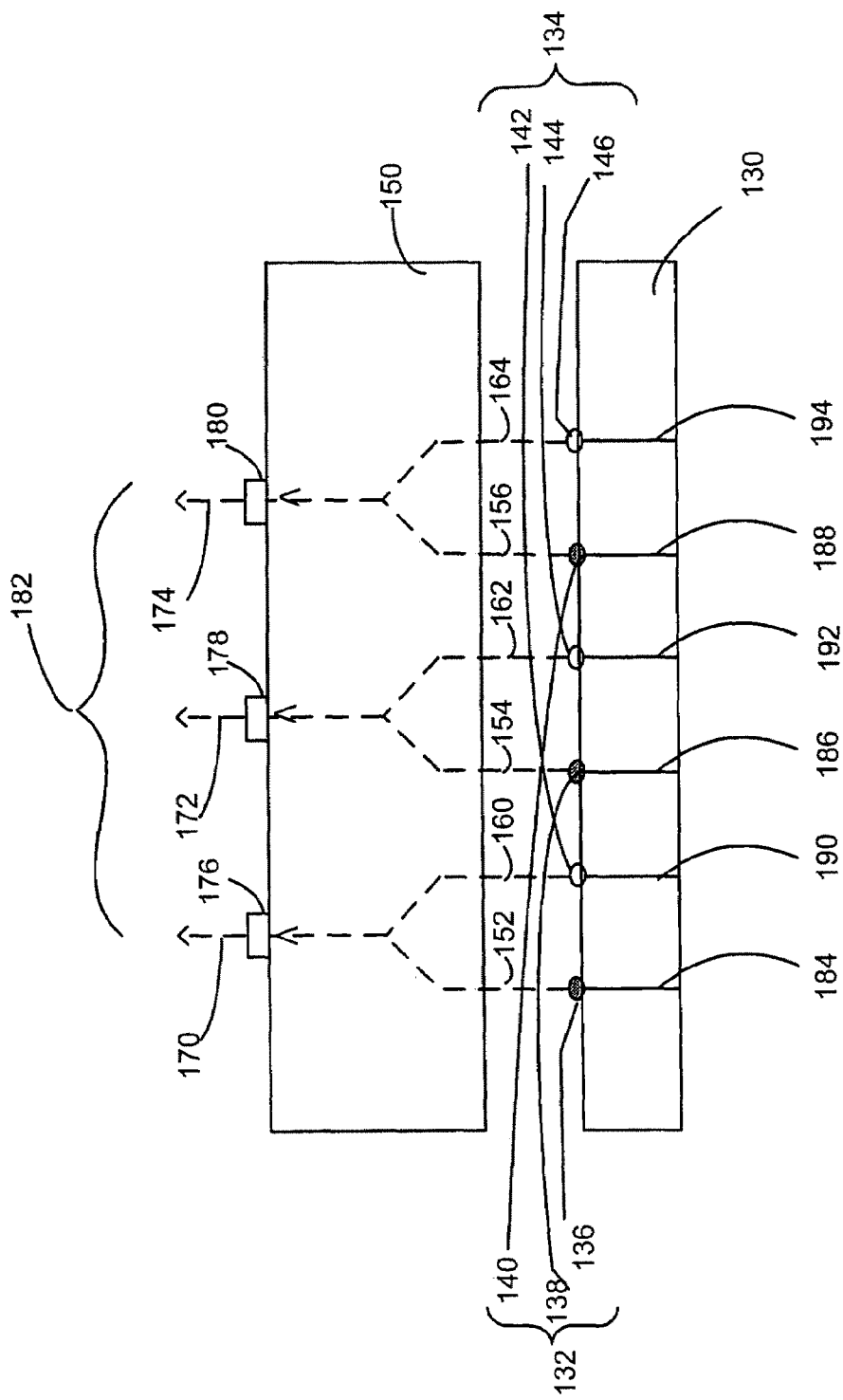
FIG. 4 depicts optical superposition of interleaved display subunits formed on the same substrate.

FIG. 4 illustrates an alternative embodiment in which two display subunits 132 and 134 are formed on substrate 130 in interleaved form: first display subunit 132 is made up of display elements 136, 138, and 140, which alternate with display elements 142, 144, and 146 of second display subunit 134. Optical system 150 receives optical signals 152, 154, and 156 from display elements 136, 138, and 140 of first display subunit 132, and optical signals 160, 162, and 164 from display elements 142, 144, and 146 of second display subunit 134, and combines them optically to form superimposed display 182, which is made up of superimposed display elements 176, 178, and 180, which emit optical signals 170, 172, and 174, respectively. Optical system 150 may include any of the various types of optical components, as discussed in connection with FIG. 3. Substrate 130 may include control lines 184, 186, and 188 for driving activation of display elements 136, 138, and 140 in first display subunit 132 and control lines 190, 192, and 194 for driving activation of display elements 142, 144, and 146 in second display subunit 134.

Figure 5:
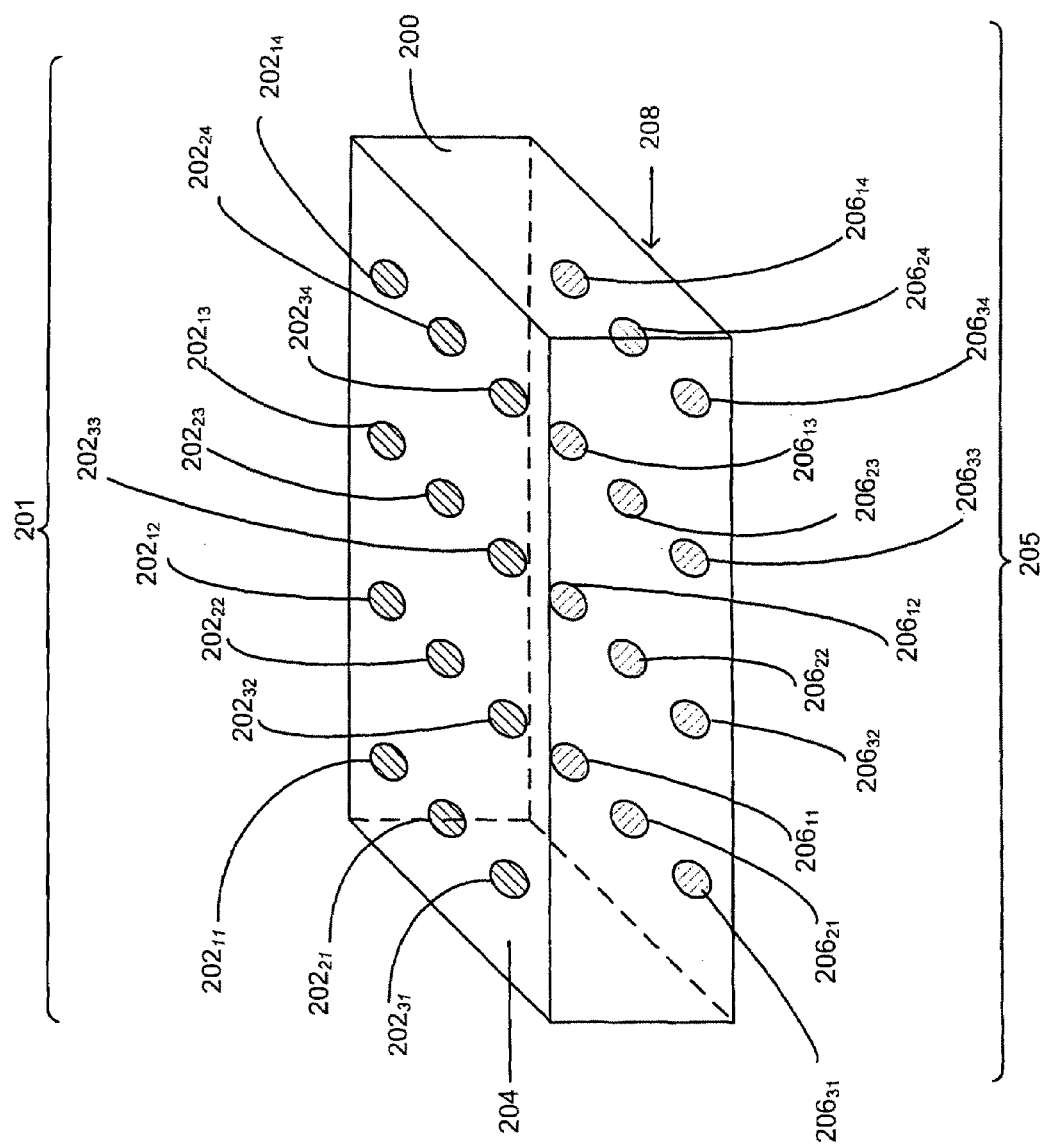
FIG. 5 depicts physical superposition of display subunits formed on a transparent substrate.

FIG. 5 depicts a further embodiment of a superimposed display in which display elements are formed in two planes of a substantially transparent substrate 200.

First display subunit 201, made up of display elements $202_{rc}$, (row r=1 ... 3, column c=1 ... 4) is formed in a first plane, on surface 204 of substrate 200. Second display subunit 205, made up of display elements $206_{rc}$, (row r=1 ... 3, column c=1 ... 4) is formed in a second plane, at second surface 208 of substrate 200. First display subunit 201 is physically superimposed on second display subunit 205. Substrate 200 may be substantially transparent to permit light from first display subunit 201 and second display subunit 205 to be visible from at least one direction, e.g., at first surface 204 of substrate 200. In this context, substrate 200 may be considered substantially transparent if it is substantially transparent to wavelengths or wavebands emitted by display elements $202_{rc}$, and $206_{rc}$, and not necessarily to other wavelengths or wavebands. In this example, display elements are superimposed physically and need not be superimposed optically, though in some embodiments it may be advantageous to use an optical system in combination with physically superimposed display elements or display subunits. Various materials may be used to form a transparent substrate as depicted in FIG. 5, including, but not limited to glass, various plastics (e.g. glass, polycarbonate, selected semiconductor materials, plastics, or other polymers) etc. Transparent light emitting or modulating elements may also be used, e.g. certain types of organic light emitting diodes such as are commercially available from a number of sources.

In some embodiments, a display may include a first plurality of light modulating elements and a second plurality of light modulating elements, with each light modulating element of the second plurality superimposed with a corresponding light modulating element of the first plurality to produce a superimposed display element. Overlap of the first plurality of light modulating elements and the second plurality of light modulating elements may form a plurality of superimposed display elements that together form a superimposed display.

The display may also include electronic circuitry configured to control operation of light modulating elements of the first plurality of light modulating elements to supplement operation of light modulating elements in the second plurality of light modulating elements to produce a desired light modulation pattern in the superimposed display. In some embodiments, the electronic circuitry may be configured to control light modulating elements of the first plurality and light modulating elements of the second plurality so that the desired light modulation pattern has a higher spatial frequency content than light modulation patterns produced by either of the first plurality and the second plurality. In other embodiments, the electronic circuitry may be configured to control light modulating elements of the first plurality and light modulating elements of the second plurality so that the desired light modulation pattern is a time-varying light modulation pattern with a higher temporal frequency content than light modulation patterns produced by either of the first plurality and the second plurality. In various embodiments, the electronic circuitry may be configured to control light modulating elements of the first plurality and light modulating elements of the second plurality so that the desired light modulation pattern has a higher information content than light modulation patterns produced by either of the first plurality and the second plurality. For example, the information represented in one or more parameters of the desired light modulation pattern may be represented by modulation of the amplitude, polarization, direction or spatial orientation of light emission, color content, duration, or overall energy of light.

First and second display subunits used to form a superimposed display may be in the same substrate, as depicted in FIGS. 3-5. In some embodiments, first and second display subunits may be non-overlapping, but superimposed optically. They may be in the same layer, levels, or surface of the substrate, or in different layers, levels, or surfaces of the substrate. Layers, levels, or surfaces containing superimposed display subunits may be planar, as illustrate in FIGS. 3-5, or non-planar. Moreover, layers, levels, or surfaces containing superimposed display subunits may be parallel in some embodiments, but in other embodiments may be non-parallel. First and second display units may be interleaved. In some embodiments, e.g, as depicted in FIG. 5, first and second display subunits may be at least partially physically overlapping. Display elements may not need to be perfectly physically superimposed. If display elements are partially superimposed, or non-superimposed but interleaved and sufficiently close to each other, they may be combined by the viewer's eye.

In some embodiments, display subunits may include two or more different types of display elements. In the exemplary embodiment depicted in FIG. 6, two display subunits 260 and 270 are provided, each of which includes three different types of display elements. In this example, display elements which emit light in red, green, and blue wavelength bands are included, as indicated by r, g, and b, respectively. Display elements in display subunit 260 are superimposed with display elements in display subunit 270 by optical system 290, which may include various components as described previously, such as one or more lenses, lenslets, reflectors, diffractive elements, combiners, polarization selective elements, or waveguides. For example, red display elements 262 and 268 in display subunit 260 may be superimposed with red display elements 272 and 278, respectively, in display subunit 270. Similarly, green display element 264 in display subunit 260 may be superimposed with green display element 274 in display subunit 270, blue display element 266 in display subunit 260 may be superimposed with blue display element 276 in display subunit 270, and so forth. Thus, each display element may be superimposed with a display element of a like type, which in this example is a display element that emits light in a like wavelength band. Superposition of display elements that emit light in the same wavelength band (e.g., red display elements 262 and 272 in display subunits 260 and 270, respectively) produces a superimposed display element that emits light in the same wavelength band as the display elements from which it is formed (e.g. superimposed display element 284 in superimposed display 290 emits red light).

Figure 6:
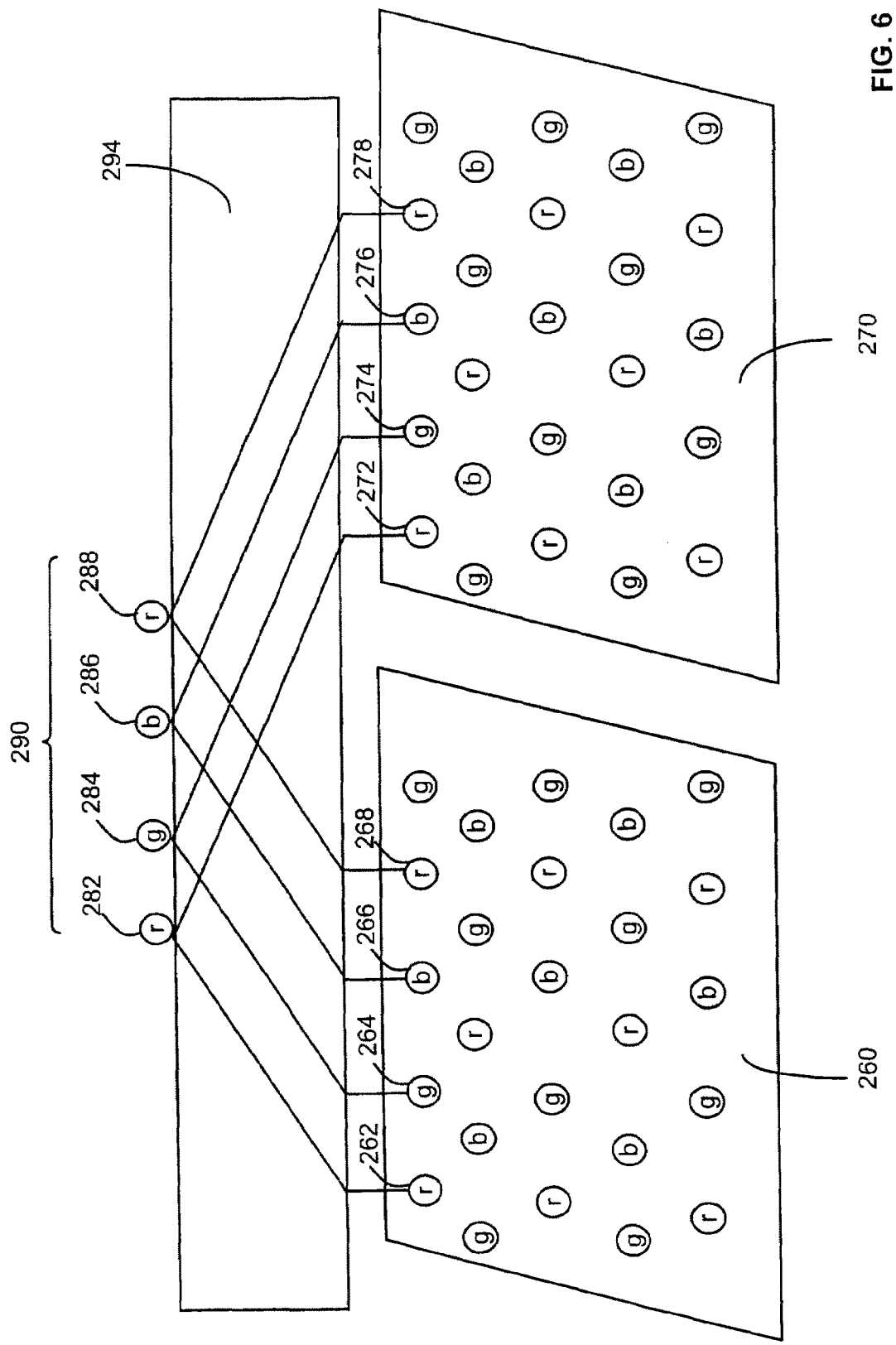
FIG. 6 illustrates superposition of display subunits including several different colors of display elements.

As illustrated in FIG. 6, a display may include a first display subunit including a first plurality of light emitting elements and a second display subunit including a second plurality of light emitting elements. Each light emitting element in the first plurality and the second plurality may be designed to emit light in a characteristic wavelength band. The display may also include an optical system configured to optically superimpose each light emitting element of the first plurality with a corresponding light emitting element of the second plurality, with superimposed light emitting elements designed to emit light in a like wavelength bands. In some embodiments, the display may also include electronic circuitry configured to control one or more light emitting elements in the second display subunit to compensate for one or more bad light emitting elements in the first display subunit. The electronic circuitry may be configured to detect one or more bad light emitting elements in the first display subunit, and in response to adjust one or more corresponding light emitting elements in the second display subunit to compensate for the one or more bad light emitting elements in the first display subunit.

Display subunits may include two or more subsets of light modulating elements, with each subset designed to modulate light in a respective wavelength band, and each respective wavelength band different from the respective wavelength band of at least one other subset of light modulating elements. If a display subunit includes two or more subsets of light modulating elements, each subset of light modulating elements may be distinguishable from another of the two or more subsets by at least one light emission parameter, including wavelength band envelope, spectral width, power, emission pattern, polarization, direction or spatial orientation of light emission, response speed, or linearity. Light modulating elements of the two or more subsets may be arranged in a repeating pattern according to the light modulation wavelength band of the light modulating elements. The first and second display subunits may be controlled to simultaneously produce substantially identical first and second light patterns within the superimposed display area. Light emitting elements of the first display subunit may be optically superimposed with light emitting elements of the same type in the second display subunit.

Figure 7:
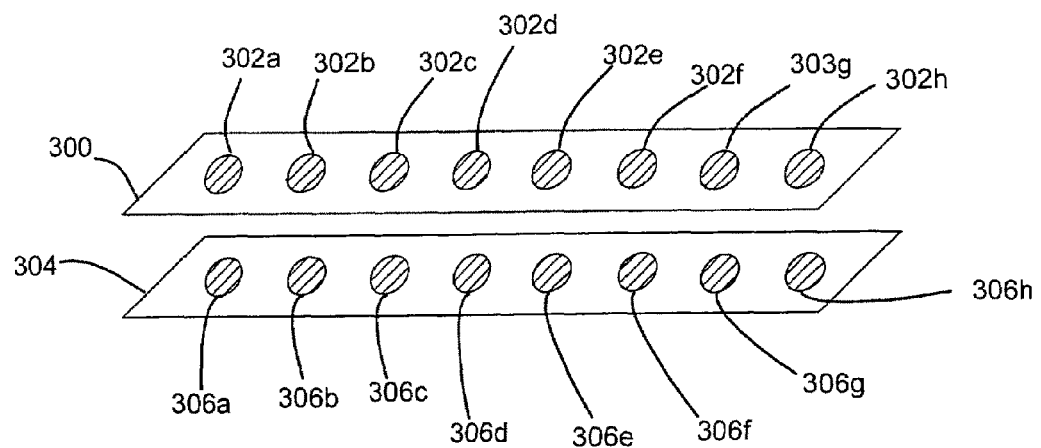
FIG. 7 depicts superimposed linear arrays of display elements.
Figure 8:
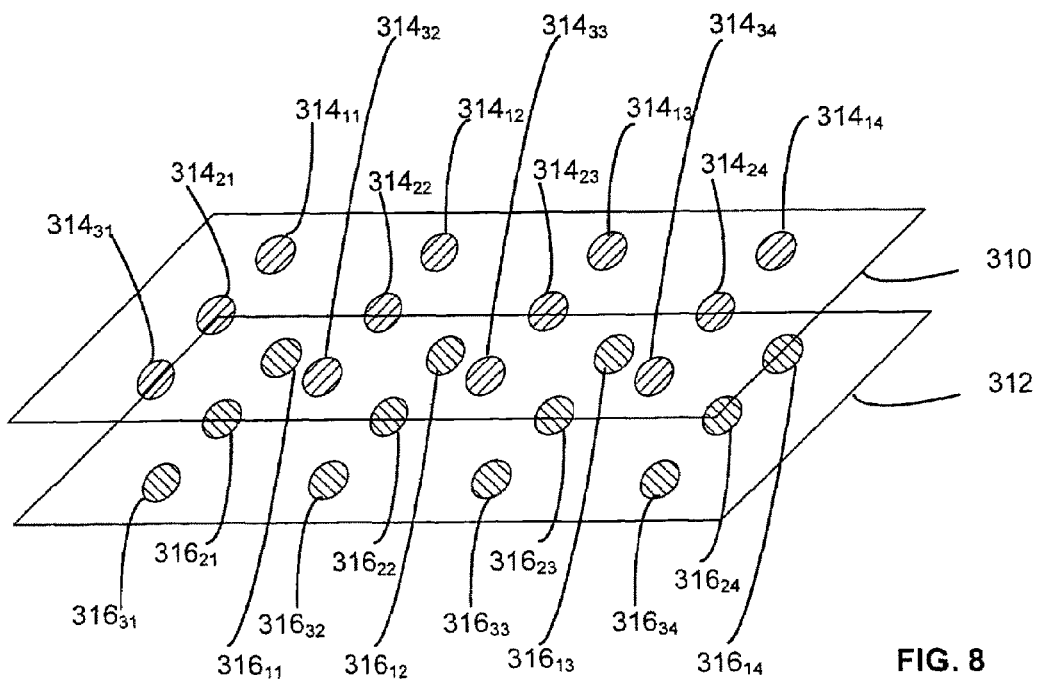
FIG. 8 illustrates superimposed two-dimensional arrays of display elements.

A display subunit may include at least two subsets of light emitting elements, with each subset including light emitting elements designed to emit light in one of at least two different characteristic wavelength bands. For example, display subunits may include a first subset of light modulating elements designed to emit light in a red wavelength band, a second subset of light modulating elements designed to emit light in a green wavelength band, and a third subset of light modulating elements designed to emit light in a blue wavelength band. In some embodiments, the first display subunit may be in a first substrate and the second display subunit may be in a second substrate. The first and second substrates may be non-overlapping, or they may be at least partially overlapping. In related embodiments, each of the first and second display subunits includes light emitting elements of at least two types, each type designed to emit light that differs from light emitted by display elements of other types by one or more parameters including wavelength band envelope, spectral width, power, emission pattern, polarization, direction or spatial orientation of light emission, response speed, or linearity, and wherein light emitting elements of the first display subunit are optically superimposed with light emitting elements of the same type in the second display subunit. Display subunits may have various configurations of display elements. For example, as depicted in FIG. 7, each of the first display subunit 300 and second display subunit 304 may include a linear array of light emitting elements 300a-h and 306a-h, respectively. In other embodiments, as illustrated in FIG. 8, first display subunit 310 and second display subunit 312 may include two-dimensional arrays of light emitting elements, $314_{rc}$ and $316_{rc}$, respectively (where r=1-4 and c=1-3). Two types of light emitting elements may be arranged in like repeating patterns in first and second display subunits. In some embodiments, the repeating patterns may be spatially periodic.

A display may include a first display subunit comprising a first plurality of light modulating elements and a second display subunit comprising a second plurality of light modulating elements. Each light modulating element of the first and second pluralities of light modulating elements may be designed to modulate light in a respective characteristic pattern. The display may include an optical system configured to optically superimpose each light modulating element of the first plurality with a corresponding light modulating element of the second plurality designed to modulate light in a like characteristic pattern. The display also may include electronic circuitry configured to control operation of light modulating elements in the first display subunit to compensate for defective light modulating elements in the second display subunit.

As illustrated by the various disclosed embodiments, displays may be formed from the superposition of two or more display subunits including a plurality of display elements on a substrate. Specific types of display elements may be positioned on a substrate at selected locations, to form a display having a desired arrangement of display elements. In some embodiments, display elements may be formed integrally with the substrate, while in others, display elements may be formed separately from the substrate and subsequently positioned on the substrate. In some embodiments, display subunits may be formed separately and subsequently combined, while in other embodiments, display subunits may be distinct functional entities within the display but may be manufactured as a single structure. Substrates on which display subunits are formed may include, but are not limited to silicon based materials, semiconductor materials, polymers, ceramics, metals, and composite materials. Substrates may include electrical lines for carrying power and control signals, formed by various methods as known to those of skill in the relevant arts. In some embodiments, substrates may include various types of electronic circuitry, which may be used to control or configure display subunits and superimposed displays.

Display elements in a display subunit may be arranged in a pattern having short-range order or long-range order. Patterns having either short-range order or long-range order may incorporate repeating patterns. In an embodiment particularly suited for the design of three color displays, as commonly used in television or computer screens, three distinct types of display elements may be used. A repeating pattern unit may include at least one red display element, at least one green display element, and at least one blue display element, as depicted, for example, in FIG. 6.

Figure 9:
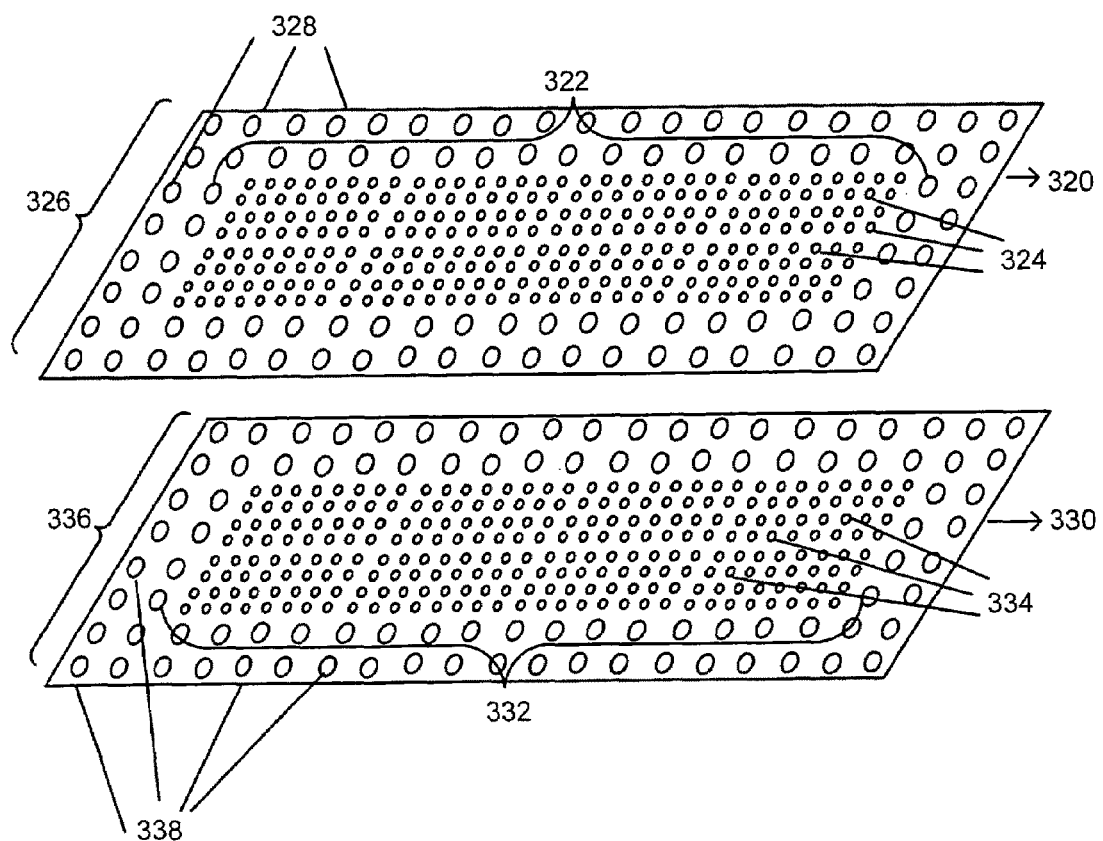
FIG. 9 illustrates superimposed display subunits having non-uniform distributions of display elements.

Some embodiments may include display elements arranged in regular, rectilinear N×N or M×N arrays. However, display subunits may include not only regular, rectilinear arrays, but also arrays formed from various other configurations of display elements, including arrangements of display elements that are non-uniform with respect to various parameters, including, but not limited to spacing, orientation, size, and type of display elements. Display subunits may include two or more distinct regions, configured so that within each region the display element array is regular and uniform, but between regions and across the display subunit as a whole, there is a non-uniform, irregular distribution of display elements. For example, as depicted in FIG. 9, first display subunit 320 includes a central region 322 that contains an array of display elements 324 at a first spacing and a border region 326 that contains display elements 328 at a second spacing. In this example, display elements 324 in central region 322 are more closely spaced than display elements 328 in border region 326. Second display subunit 330 similarly includes central region 332 made up of display elements 334 and border region 336 made up of display elements 338. If display subunit 320 is superimposed on display subunit 330, there is a one-to-one correspondence between display elements 324 and 334, and display elements 328 and 338, and the resulting superimposed display will have the same display elements configuration as each of display subunits 320 and 330. In some embodiments, display subunits may include arrangements of display elements that do not include uniform regions but are non-uniform as a whole. Non-uniform distributions may include gradients with respect to display element size, color, etc., for example, running from one side of a display subunit to another, or from the center of a display element array to the edges. Non-uniform display subunits may be non-uniform but have a statistical distribution of display elements over some or all of the subunit. In certain embodiments, spatial distribution of display elements over a subunit may be random or quasi-random.

Figure 10:
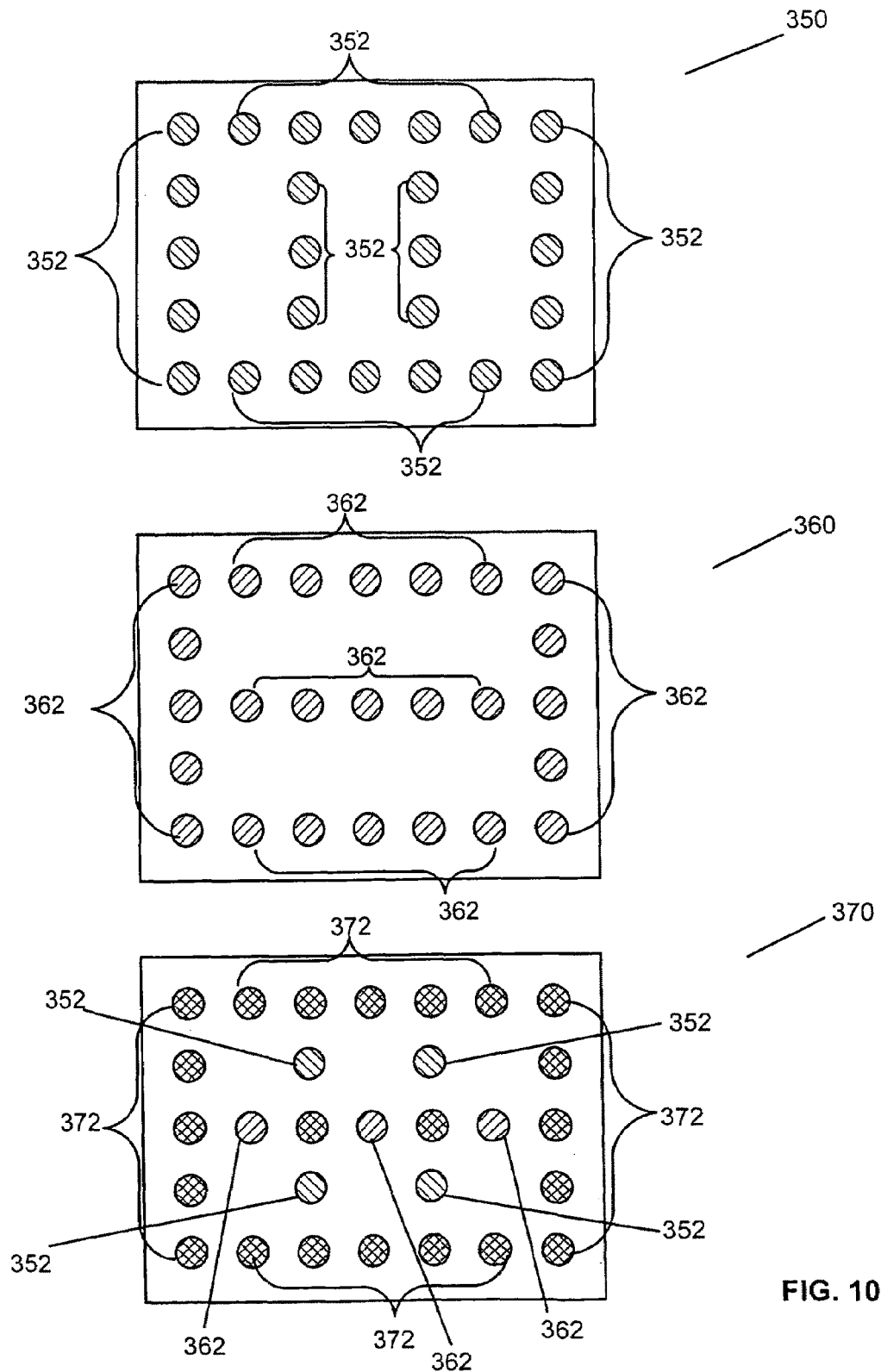
FIG. 10 depicts superimposed display subunits having partially overlapping distributions of display elements.

In many cases, there will be a one-to-one correspondence between display elements in display subunits to be superimposed, and the subunits and the superimposed display formed from the subunits will all have the same number and arrangement of display elements. However, in certain embodiments, a portion, but not all of the display elements may be superimposed, and the display element configuration will not be identical between the display subunits and the resulting superimposed display. For example, as illustrated in FIG. 10, first display subunit 350 may include display elements 352 arranged in a first pattern, and second display subunit 360 may include display elements 362 arranged in a second pattern. Superposition of first display subunit 350 and second display subunit 360 produces superimposed display 370, which includes a plurality of superimposed display elements 372, and also independent display elements 352 from first display subunit 350, and independent display elements 362 from second display subunit 360, which are not superimposed with any other display elements.

Display elements may include various types of light modulating elements. Light modulating elements may include elements which modulate light perceived by a viewer of the display. In some embodiments, light modulating elements may be light emitting elements. Light emitting elements may be organic or inorganic wavelength converters, phosphors, fluors, laser diodes, light emitting diodes, organic light emitting diodes, polymer light emitting diodes, quantum dots, electroluminescent devices, chemiluminescent devices, polymers, or nonlinear optical materials. Each type of light emitting element may be capable of emitting light in a respective wavelength band. Light emitting elements may be capable of emitting light in a wavelength band corresponding to one or more colors, responsive to a control signal. A display element suitable for assembly into multicolor displays having a plurality of elements may include a light emitting element capable of emitting light in respective range corresponding to one or more of the colors of the display. Light emitting elements may be capable of emitting light in a wavelength band corresponding to one or more colors, responsive to a control signal. Light emitting elements may emit light in response to an electrical control signal (e.g., current or voltage), and/or an electromagnetic control signal (e.g., an electron beam or incident light). In some embodiments, light modulating elements may modify or modulate light incident on the display to produce a particular visually detectable effect on the display by, for example, absorbing, reflecting, diffracting, scattering or otherwise modifying light impinging on the display. Thus, in such embodiments, display elements may have a characteristic light absorption spectrum, reflection spectrum, etc., instead of or in addition to a light emission spectrum. Light modulating elements may function to vary one or more light parameters, including but not limited to amplitude, polarization, direction or spatial orientation of light emission, color content, duration, or overall energy of light. Light modulating elements may include various devices or structures, including nematic crystals, polarizers, photoabsorptive materials, MEMS structures, or optical polymers, or other types of elements that can vary the amplitude, polarization, color content, duration, overall energy or other aspects of the light.

In various embodiments, superimposed display subunits are configured to compensate for 'bad', non-functioning, or malfunctioning display elements. The use of superimposed display subunits offers the possibility of providing enhanced display element function relative to what can be obtained with a single display element. By superimposing display elements, it is possible to produce superimposed display elements having a broader dynamic range, broader spectral composition, or other features. By superimposing display elements having different spectral wavebands, it is possible to produce superimposed display elements with a spectral waveband that might not be produced (or might not be produced in a convenient or practical manner) by a single display element. If superimposed display elements are of different types (varying in waveband, optical polarization, direction or spatial orientation of light emission, or any of various other parameters), it may be possible to provide various enhanced display properties. Enhanced display properties may include light emission or modulation patterns with greater information content, with information being reflected in modulations of any of various light parameters, including but not limited to those listed above and elsewhere herein. By controlling spatial and temporal patterns of activation of display elements in the display subunits appropriately, light modulation patterns may be produced which have greater complexity than may be obtained with any display element individually. For example, groupings of display elements in the superimposed display may be produced by offsetting display subunits relative to each other so that display elements are not perfectly superimposed, but are adjacent each other in the superimposed display. Simple or low frequency patterns of activation of display elements in a single subunit can be superimposed with other simple/low frequency activation patterns in other subunits to produce more complex and higher frequency activation patterns in the superimposed display. Thus, displays formed by superposition of two, three, or more display subunits may produce a much wider variety of light modulation patterns than are available with a single display subunit or single layer display.

Display elements may be distinguished from each other by various characteristics, of which the following are only exemplary: intensity of emitted light, power consumption, size, shape, wavelength band envelope, spectral width, spectral content, power, intensity, brightness, irradiance, emission pattern, direction or spatial orientation of emission, polarization, response speed, and linearity. Moreover, display elements may have a characteristic spectral response that is not based upon light emission, but rather upon some form of light modulation, including, but not limited to, light reflection, refraction, absorption, or scattering. Display elements may include various types of light-emitting or -modulating elements. Each type of light-emitting element may be capable of emitting light in a respective wavelength band. Light-emitting elements may be, for example, inorganic wavelength converters, organic wavelength converters, phosphors, fluors, laser diodes, light-emitting diodes, organic light-emitting diodes, polymer light-emitting diodes, quantum dots, polymers, polymer, electroluminescent devices, chemiluminescent devices, or nonlinear optical materials. Display elements that are formed separately and subsequently assembled to a substrate may include a polymeric carrier or a silicon-based carrier. Light-emitting elements may be capable of emitting light in a wavelength band corresponding to one or more colors, responsive to a control signal. Light-modulating elements may include structures including nematic crystals and polarizers, such as those found in LCDs, photoabsorptive materials, MEMS structures, optical polymers, or other types of elements that can vary the amplitude, polarization, color content, pulse-duration or pulse-format, overall energy or other aspects of the light. Although specific types of light modulating elements may be referenced in connection with certain exemplary embodiments described herein, unless it is stated that a particular type of light modulating element is required for use in a particular embodiment, it should be assumed that other types of light modulating elements may be used in the embodiment as well.

Display elements may be formed separately and subsequently assembled into an array to form a display subunit. Such display elements are described, for example, in United States patent application entitled ELEMENTS FOR SELF-ASSEMBLING DISPLAYS, filed Mar. 11, 2005, Ser. No. 11/078,207, and in United States patent application entitled SELF ASSEMBLING DISPLAY WITH SUBSTRATE, filed Apr. 4, 2005, Ser. No. 11/099,409, both of which are incorporated herein by reference in their entirety. Alternatively, display elements may formed integrally with a substrate to form a display subunit. Display elements formed by various methods may include various components in addition to a light modulating or light emitting element. A display element may include one or more inputs for receiving power and/or control signals. For example, the display element may include at least one contact for forming an electrical or optical connection with a substrate or another display element to receive power or control signals. In some embodiments, the display element may include a radio transmitter, receiver or transceiver for sending or for receiving an RF control or data signal. The display element may include a power signal input such as a receiver coil or antenna for receiving electromagnetic power. In some embodiments, display elements may include various other structures that convert energy or power received from external sources to light, including, for example, photovoltaic, fluorescent, and chemoluminescent devices. In some embodiments, the display element may include a power source, which may be a battery or other power-generating, -collecting, -transducing or -accumulating device or structure, such as a photovoltaic cell, an inductive coil, an antenna, or an energy-scavenging device.

Control signals for controlling generation or modulation of light by a display element may be transmitted to display elements via data-links such as acoustic, optical, magnetic or electrical links. Display elements may include a transceiver that allows data and control signals to be sent between display elements and external control circuitry, without electrical connections between display elements. Display elements may be responsive to control signals in the form of electrical or electromagnetic energy (e.g., UV light or an electron beam) targeted on the display element. Display elements may emit light in response to an electrical control signal (e.g., current or voltage), an electromagnetic control signal (e.g., an electron beam or incident light), or other control signal. A display element may emit light in response to a control signal. In some embodiments, a display element may turn off in response to the control signal, while in still other embodiments, the pattern of light emission or modulation produced by a display element may be modulated by a control signal; e.g., the amplitude or pulse frequency of emitted light may be modified in response to a control signal. The response of a display element to a control signal may be modified by electronic circuitry or components in or associated with the display element, which may store one or more configuration settings for the display element. For example, a control signal may direct a display element to 'turn on' or 'turn off', while the amplitude of light emission may be controlled by a gain value setting stored in the display element. Various parameters light modulation by the display element may be determined at least in part by one or more configuration settings stored in the display element, which may be stored in the form of data values stored in a memory location, in the setting of electronic circuitry, or in other forms as known by those of skill in the relevant arts. A configuration setting in a display element may regulate various parameters of light emission, including but not limited to pulse repetition pattern, wavelength band envelope, spectral width, intensity, emission pattern, polarization, direction or spatial orientation of light emission, response speed, or linearity.

In some embodiments, each display element may include a unique identifier. Each display element may be capable of storing identifying information. The unique identifier may be a number or code stored in various formats detectable or readable by external devices and/or by other components within the display. For example, the unique identifier may be an RFID or other type of electromagnetically responsive element. The unique identifier may be a pattern of bits stored in any of various types of data storage elements in or on the display element, for example, in electronic, optical, or magnetic form. In some embodiments, the identifying information may be updatable, for example, by circuitry on the display element, by a control signal sent from the substrate, or by a control signal sent from a location remote from the substrate. The identifying information may include address information specifying the location of the display element on the substrate. Various identification structures other than RFID structures may also be appropriate. Electromagnetically responsive elements that are responsive to electromagnetic radiation of various other frequencies, for example, microwave and sub-RF frequencies, may be used as identification structures or tags. Electromagnetically responsive elements for use as identification structure are not limited those that are responsive to any particular frequency range. In other embodiments, each display element may include an optically responsive structure that responds selectively to its respective identification information.

By superimposing two display subunits, it is possible to reduce the number of non-functioning display elements in the superimposed display relative to the display subunits. If both display subunits are driven with the same activation or control signal, the image generated by the superimposed display may have fewer defects than the image produced by either display subunit by itself. For example, in FIG. 1, by superimposing two display subunits, each of which contains three non-functioning display elements, it is possible to produce a superimposed display that has only one completely non-functioning display element. Of the functioning display elements, several operate at 1X fluence, and several operate at 2X fluence, which may be satisfactory for many applications.

An alternative method of modifying display performance is exemplified by the scheme depicted in FIG. 2, in which display elements $52_{rc}$ in a second display subunit 50 are activated in a pattern specifically selected to compensate for defects in a first display subunit 40. In the superimposed display 60, superimposed display elements $62_{rc}$ all produce light at the same fluence level, because each superimposed display element is formed from one active or functional display element superimposed with one inactive or non-functional display element.

Figure 11:
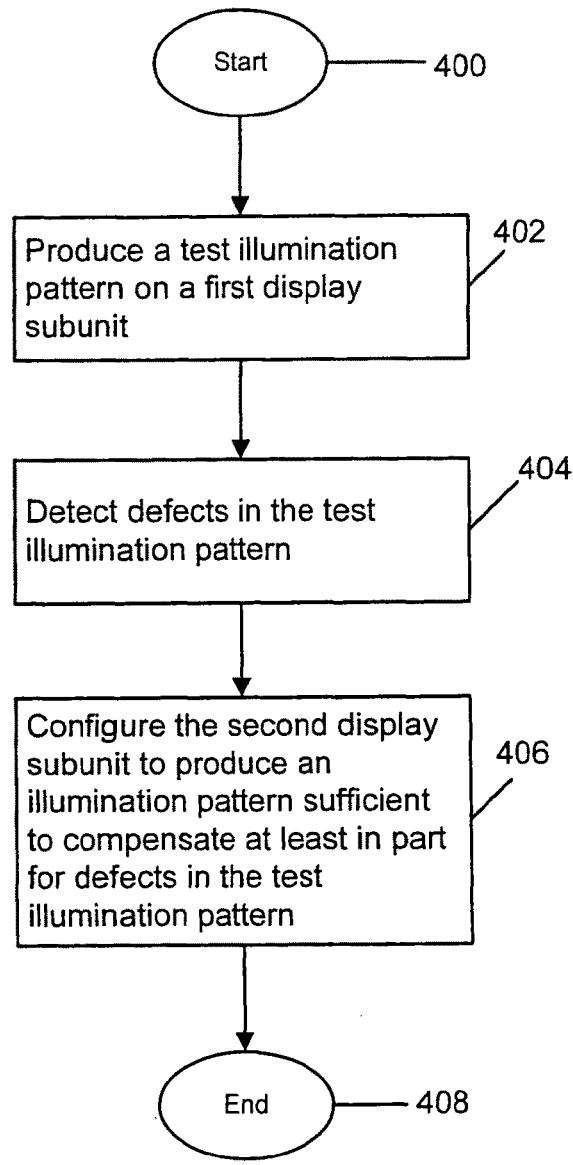
FIG. 11 is a flow diagram of a method for configuring a superimposed display.

In order to configure subunits of a superimposed display to operate as depicted in FIG. 2, a process may be performed as shown in FIG. 11. FIG. 11 depicts an exemplary method of configuring a display including superimposed first and second display subunits, which includes the steps of producing a test illumination pattern on the first display subunit at step 402, detecting defects in the test illumination pattern at step 404, and configuring the second display subunit to produce an illumination pattern sufficient to compensate at least in part for defects in the test illumination pattern, at step 406. Configuring the second display subunit may include configuring an electronic circuit controlling activation of the second display subunit, which may entail configuring one or more of hardware, software, or firmware controlling activation of the second display subunit.

With regard to steps 402 and 404 in FIG. 11, various test illumination patterns may be used, and various approaches may be used for detecting the generated illumination. In one alternative, all display elements may be illuminated simultaneously. In other alternatives, one or a few display elements may be illuminated in a known sequence. Illumination of a display element may be detected with an optical sensor, by detecting an electrical correlate of display element illumination, or by detecting any other parameter that provides an indication of whether or not a display element is functional.

Figure 12:
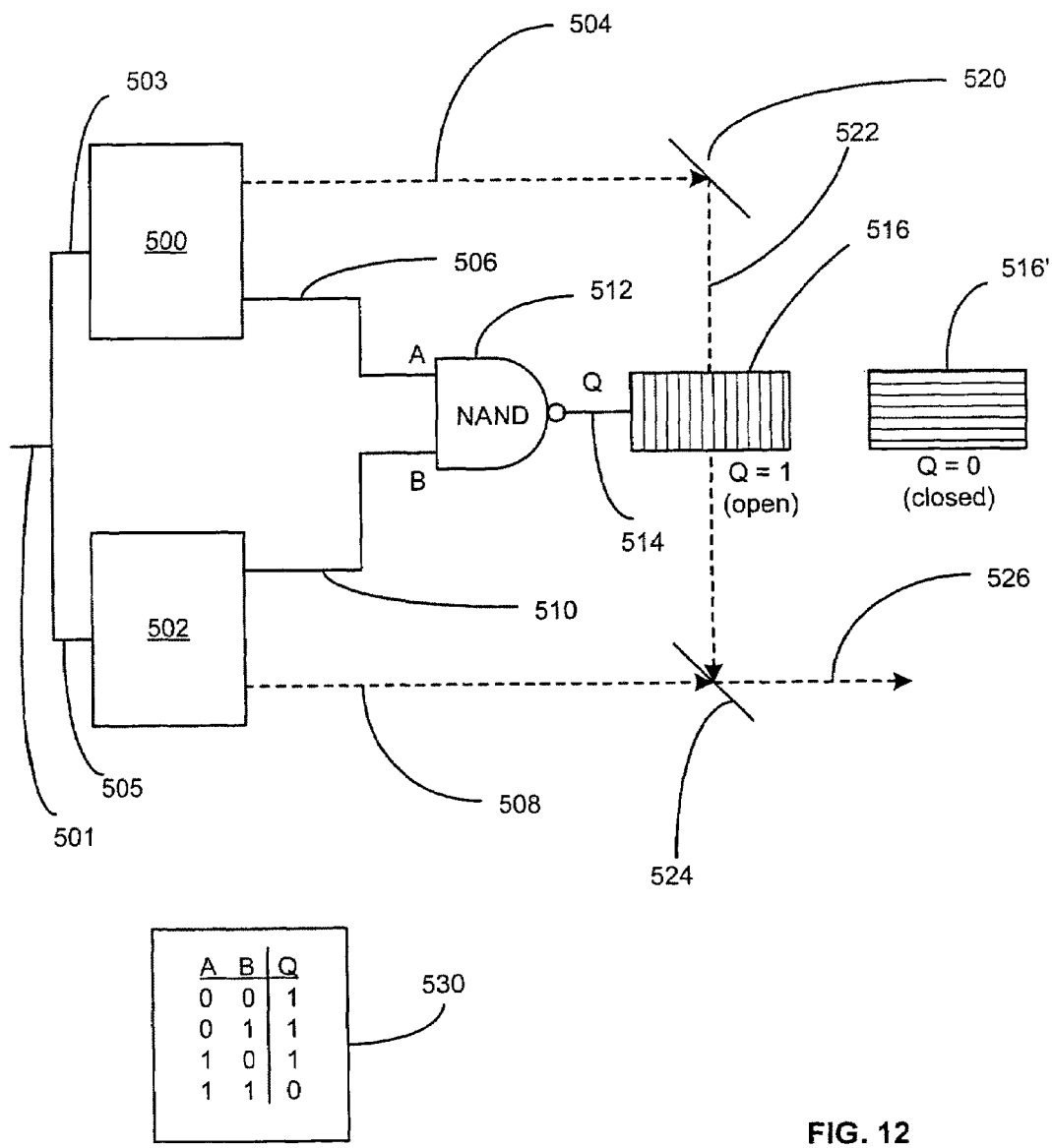
FIG. 12 is a schematic diagram of electrical and optical components for configuring display elements.

In some embodiments, display units may be tested and configured prior to assembly. In other embodiments, display subunits may be assembled to form a superimposed display, and subsequently tested and configured. One exemplary method of producing a display includes superimposing first and second display subunits having substantially identical arrangements of light modulating elements to form a superimposed display area, wherein each light modulating element of the first display subunit is designed to modulate light in a respective characteristic pattern, and wherein each light modulating element of the first display subunit within the superimposed display area is superimposed with a light modulating element of the second display subunit designed to modulate light of a like characteristic pattern. The method may include controlling the first display subunit to produce a first light pattern and controlling the second display subunit to produce a second light pattern that when superimposed with the first light pattern produces a desired light pattern. The method may also include detecting the first light pattern and adjusting the second light pattern responsive to the detected first light pattern to compensate for differences between the first light pattern and the desired light pattern. Detecting a first light pattern may include detecting the light pattern optically. Alternatively, detecting a first light pattern may include detecting an electrical correlate of the light pattern. The method may include optically superimposing or physically superimposing the first display subunit and the second display subunit. In some embodiments, first and second display subunits may be controlled to produce a desired light modulation pattern having a higher spatial frequency content than light modulation patterns produced by either of the first display subunit and the second display subunit. In other embodiments, first and second display subunits may be controlled to produce a time-variant desired light modulation pattern having a higher temporal frequency content than light modulation patterns produced by either of the first display subunit and the second display subunit. In general such methods may be considered to produce a light modulation in the superimposed display area that has increased information content relative to the light modulation pattern produced by either of the display subunits independents. In further exemplary embodiments, the first and second display subunits may be controlled to produce a desired light modulation pattern having a higher information content than light modulation patterns produced by either of the first display subunit and the second display subunit. For example the information represented in one or more parameters of the desired light modulation pattern may be represented by modulation of the amplitude, polarization, direction or spatial orientation of light emission, color content, duration, or overall energy of light FIG. 12 provides an example of electrical and optical components that may be used to configure superimposed first and second display elements 500 and 502, which may be members of arrays of display elements in superimposed display subunits. For example, display element 500 may be a display element in a first display subunit, and display element 502 may be a display element in a second display subunit. A common driver signal 501 is delivered to display element 500 on input line 503 and to display element 502 on input line 505. Driver signal 501 corresponds to a desired output for the superimposed display element formed from display element 500 and display element 502. In response to driver signal 501, display element 500 may produce a light output 504. Display element 500 may also produce a logic signal A (e.g., a voltage signal) on line 506. Logic signal A indicates whether or not display element 500 is functioning properly. Logic signal A may be derived from an electronic correlate of light generation by display element 500 through the use of appropriate electronic circuitry, as known by a person of skill in the electronic arts. For example, if display element 500 is an LED, if the LED has broken down and is not functioning properly, the flow of current through the LED will be altered relative to the current flow obtained during normal operation (either there will be no conductance through the LED, or the LED will function as a conductor in the reverse direction, both conditions that can be detected by appropriately configured circuitry). In this example, Logic signal A has a value of 1 when display element 500 is functioning properly, and a value of 0 when it is not functioning properly. Similarly, display element 502 may produce a light output 508 in response to driver signal 501, and a logic signal B on line 510, which has a value of 1 when display element 502 is functioning properly and a value of 0 when it is not functioning properly. Logic signal A and logic signal B are delivered to the inputs of NAND gate 512. As illustrated in logic table 530 in FIG. 12, when the values of logic signals A and B are both 1, the output Q of NAND gate 512 is 0. For all other combinations of values of logic signals A and B, the output Q of NAND gate 512 is 1. Output Q is delivered to filter 516 via line 514. Filter 516 is an electronically configurable optical filter that may be in an optically conductive or open state when Q is 1. Devices of this type are may include LCD elements, electroabsorptive devices, or other types of controllable elements. When Q is 0, filter 516 assumes an optically non-conductive or closed state, indicated by reference number 516'. When filter 516 is in a conductive state, light 504 from display element 500 is directed to filter 516 by reflector 520, passes through filter 516, and combined with light 508 from display element 502 at combiner 524 to form combined (superimposed) light 526. Thus, light 504 and 508, from display elements 500 and 502, respectively, will be superimposed if either of the display elements is not functioning properly, thus compensating for the defective display element. However, if both display element 500 and display element 502 are functioning properly, filter 516 assumes a non-conductive state, indicated by reference number 516' in FIG. 12, which does not permit the passage of light, and light 504 from display element 500 is not combined with light 508 from display element 502.

Figure 13:
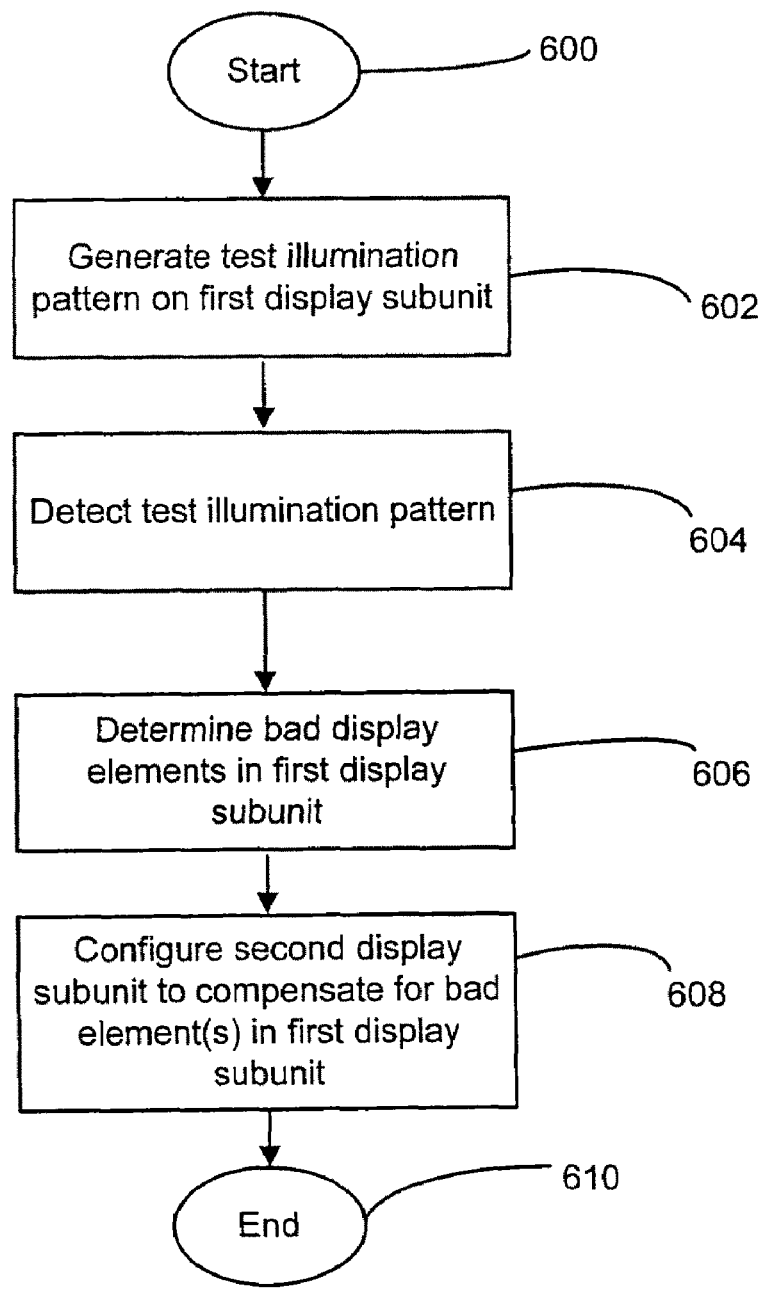
FIG. 13 is a flow diagram of a method of configuring a superimposed display.

FIG. 13 illustrates an additional method of configuring a display formed from first and second display units. At step 602, a test illumination pattern is generated on a first display subunit. At step 604, the test illumination pattern is detected. At step 606, bad display elements in the first display subunit are determined. At step 608, a second display subunit is configured to compensate for bad element(s) in the first display subunit.

Figure 14:
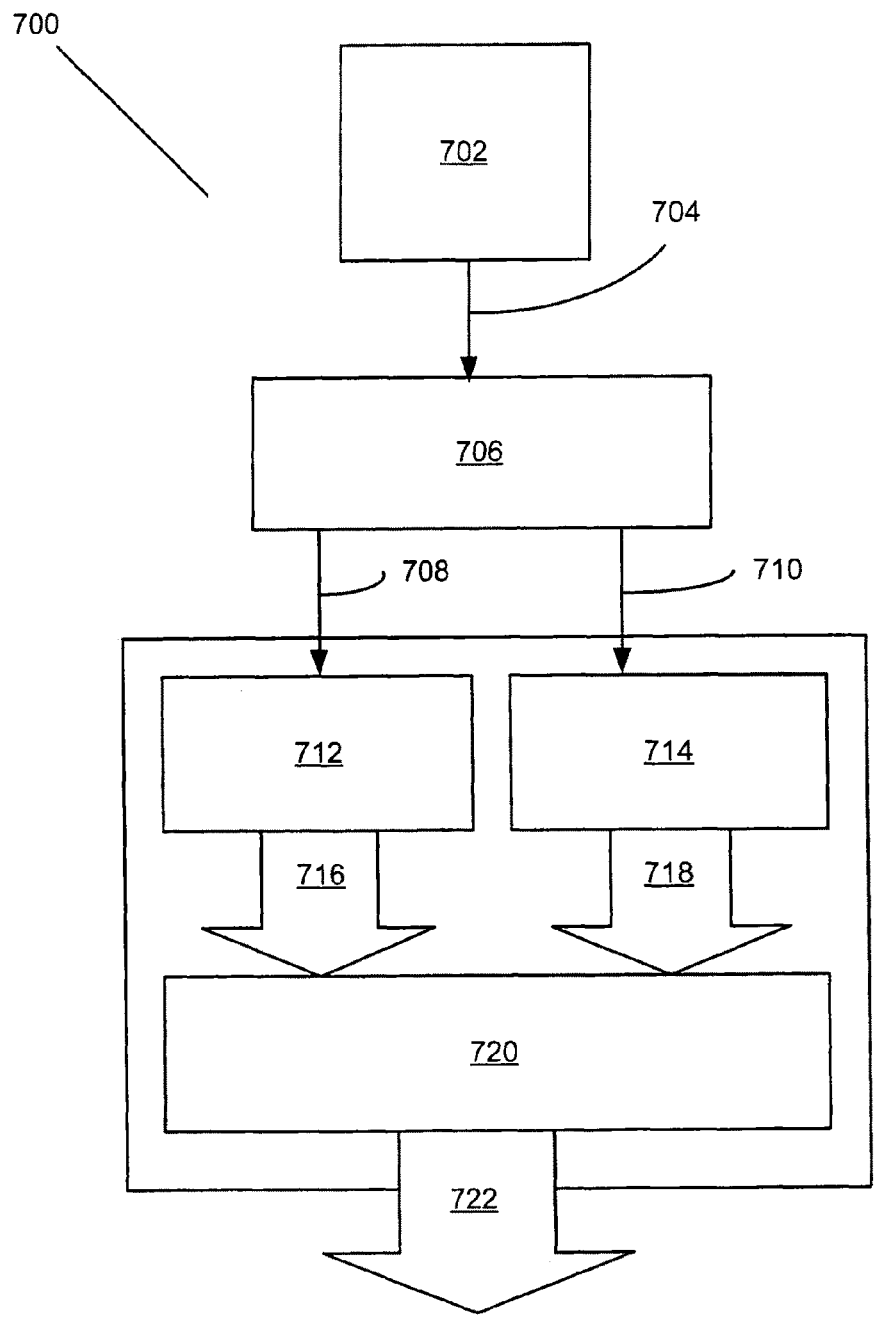
FIG. 14 is a schematic diagram of a system including a superimposed display.

FIG. 14 illustrates a system 700 in which electronic circuitry is used to configure display elements. Controller 702 generates a drive signal 704 that specifies a particular light modulation pattern 722. Drive signal 704 is received by configuration circuitry 706. Configuration circuitry 706 includes electronic circuitry for configuring display elements, which may include electronic circuitry for turning on or off (activating or deactivating) selected display elements, or for adjusting the gain of selected display elements. Activation, deactivation, or gain may be set or adjusted. Configuration circuitry 706 may be configured in a relatively permanent fashion, e.g., during the manufacture of the device, or it may be modifiable during the lifetime of the device. If configuration circuitry 706 is modifiable, system performance may be modified in response to changes in display element performance during use of the device, or in situations where a change in system performance is desired for some other reason. Configuration circuitry 706 modulates selected components of drive signal 704 to generate a first subunit drive signal 708 and second subunit drive signal 710. First subunit drive signal 708 drives first display subunit 712 to produce first light modulation pattern 716, and second subunit drive signal 710 drives second display subunit 714 to produce second light modulation pattern 718. First light modulation pattern 716 and second light modulation pattern 718 are superimposed by optical system 720 to produce light modulation 722.

In some embodiments, only one display subunit may be configured to modify performance of the superimposed display element. In other embodiments, the performance of two (or more) display subunits elements may be configured, by setting or adjusting activation, deactivation, or gain. On/off setting, gain adjustment, switching, etc. as used to configured display elements may be performed in hardware, software, or firmware, by methods known to those of skill in the relevant arts. It will be appreciated that configuration can be done at the level of the display subunit or display, or at the level of the software and/or hardware that provides driver signals to the display. Configuration performed at the level of the display subunit may include storing a configuration setting on or in association with individual display elements, by setting the value or state of a data storage element or electronic circuit component of a display element to reflect a desired display/emission mode. Such display/emission mode may be selected from multiple pre-set intensities, directions, polarizations, pulse-repetition patterns, etc. in which the display element may be able to operate. For example, a display element may be set to an 'on' configuration if a display element with which it is superimposed is known to be non-functional. As another example, the gain of a display element may be set so that when used in combination with another display element, a desired total gain may be obtained.

Figure 15:
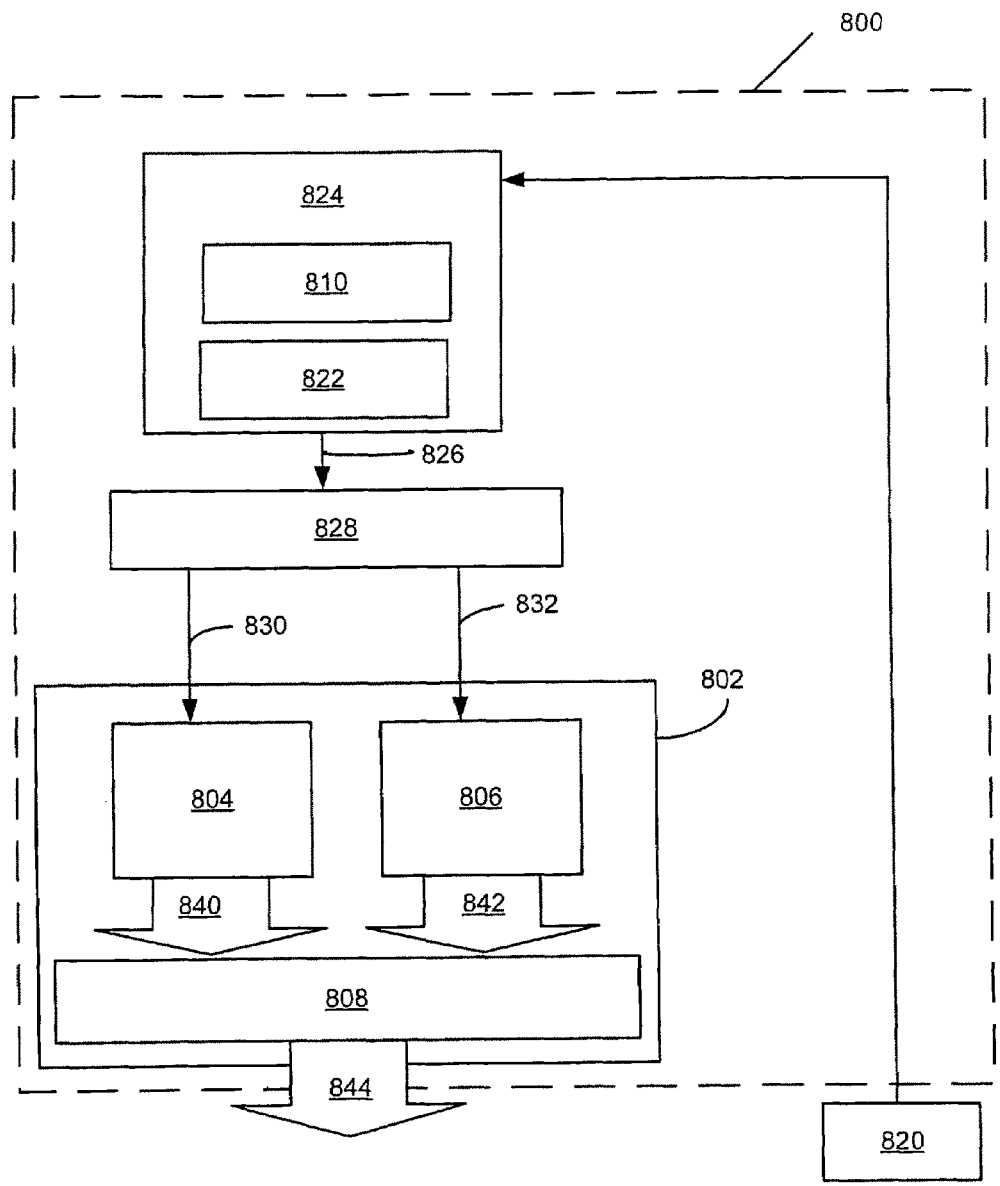
FIG. 15 is a schematic diagram of a system including a superimposed display.

FIG. 15 is a schematic diagram of a system 800 including a superimposed display 802. System 800 may be any of various types of systems that may utilize superimposed displays as described herein, including computers, televisions, and telephones, among others. Superimposed display 802 is formed from a first display subunit 804 and second display subunit 806 superimposed by optical system 808. System 800 includes microprocessor 810, input device 820, memory 822, and power supply 824. Input device 820 may be, for example, a keyboard, key pad, microphone, mouse, track ball, switch, radio receiver, or other input devices as known to those of skill in the art. System 800 may include one or more output devices, including superimposed display 802. System 800 may also include additional output devices, such as speakers, recording devices, etc. Based upon input from input device 820 and the current status of system 800, a control signal 826 is generated by microprocessor 810 and transmitted to configuration module 828. Control signal 826 may contain instructions for a desired image to be displayed on superimposed display 802. Configuration module 828 may receive control signal 826 and modulate certain components of control signal 826 (by modifying gain, etc.) to generate first subunit control signal 830 and second subunit control signal 832, for controlling display subunits 804 and 806 respectively. In response to first unit control signal 820 and second subunit control signal 832, display subunits 804 and 806 generate first light modulation pattern 840 and second light modulation pattern 842, respectively, which are superimposed by optical system 808 to produce output light modulation pattern 844, the output of superimposed display 802. Configuration module 828 may be either hardware, software, or a combination thereof. If software, configuration module 828 may reside in memory 822 of system 800. If hardware or firmware, configuration module 828 may take the form of a component of system 800, or may be a component of superimposed display 802.

Control signals for controlling generation or modulation of light by a display element may be transmitted to display elements via optical or electrical links. Control signals may include electrical signals transmitted via electronic circuitry, electromagnetic signals transmitted to display elements via a transmitter and received by a receiver (or transceiver), optical signals delivered via optical circuitry or electromagnetic signal. Display elements may be responsive to control signals in the form of electromagnetic energy (e.g., UV light or an electron beam) targeted on the display element. Display elements may emit light in response to an electrical control signal (e.g., current or voltage), an electromagnetic control signal (e.g., an electron beam or incident light), or other control signal. A control signal may cause emission of light by a light emitting element directly (e.g., in the case of an electron beam, UV beam, or other energy striking a phosphor to cause emission of light) or a control signal may be processed by electronic or optical circuitry on the light emitting element to control light emission indirectly, in which case the control signal may initiate, stop, or otherwise modulate the emission of light by light emitting elements. In some embodiments, a display element may turn off in response to the control signal, while in still other embodiments, the pattern of light emission or modulation produced by a display element may be modulated by a control signal; e.g., the amplitude or pulse frequency of emitted light may be modified in response to a control signal.

A variety of approaches to selectively activating individual elements, or groups of elements may be implemented. In a straightforward N×N or M×N array of elements, conventional row and column addressing, such as that found in many matrix array structures, such as LCDs, may be appropriate. The control electronics and tradeoffs for such addressing and selective activation are known to one of skill in the art. The display may include electronic circuitry configured for carrying electrical control signals to selected receptor locations on the substrate to control display elements at the selected receptor locations. The display may also include optical circuitry configured for carrying optical control signals to one or more selected receptor locations on the substrate to control display elements at the selected receptor locations. In some embodiments, the display may also comprise an electromagnetic radiation source, and each display element of the plurality of display elements may be selectively activatable by directing the radiation source toward the display element to activate the display element. The electromagnetic radiation source may include an electron gun or an ultraviolet radiation source. Display elements may be selectively activatable by electromagnetic energy directed onto the selected display elements at selected locations on the display. Control signals may include electromagnetic energy, e.g., ultraviolet radiation or an electron beam, and electrical signal, an optical signal, or various other control signals, as known to those of skill in the relevant art.

Figure 16:
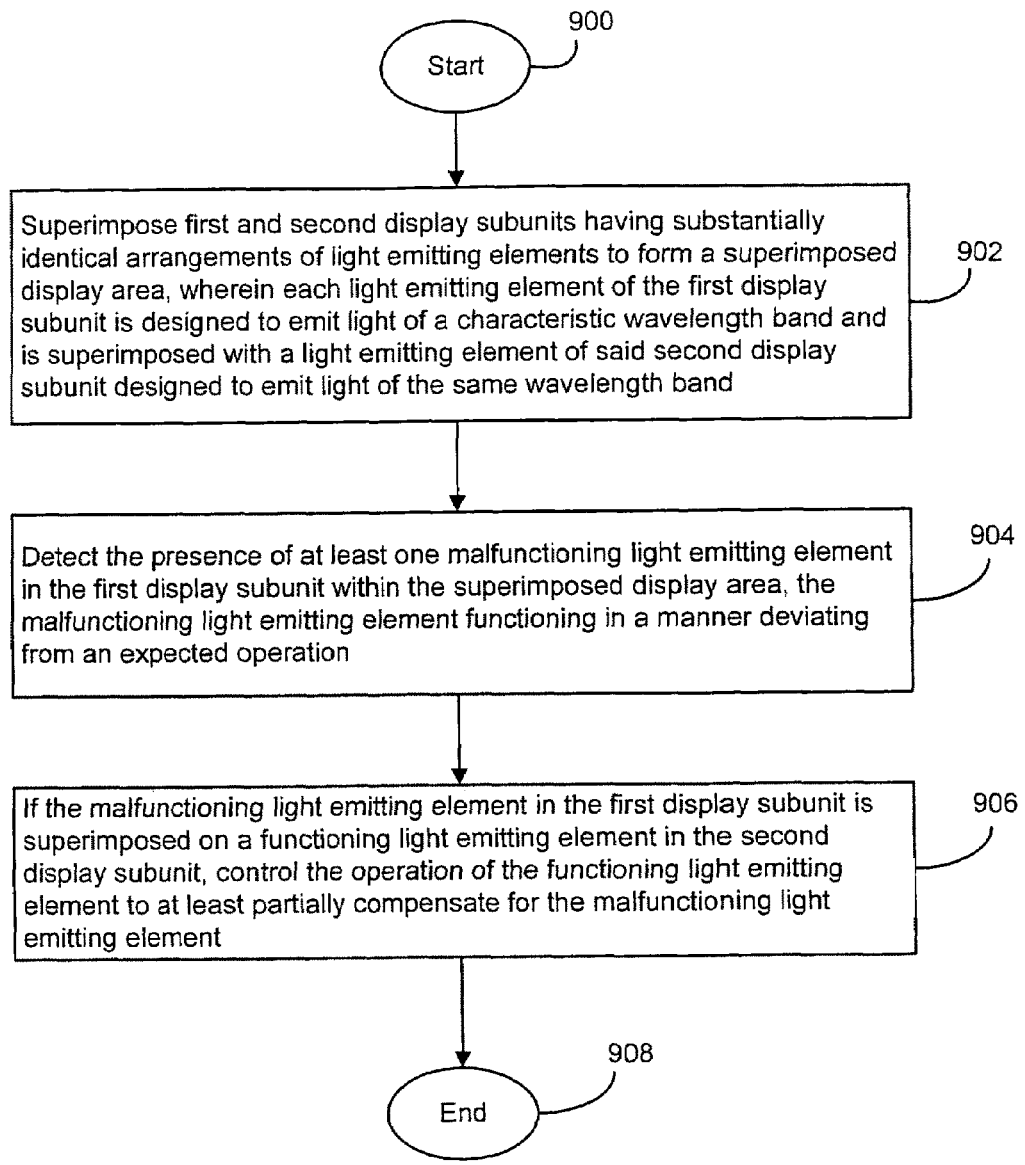
FIG. 16 is a flow diagram of a method of configuring a superimposed display.

FIG. 16 illustrates a method of improving performance of a display, through the use of superimposed display subunits. Display performance may be improved by superimposing first and second display subunits having substantially identical arrangements of light emitting elements to form a superimposed display area, at step 902. Step 904 includes detecting the presence of at least one malfunctioning light emitting element in the first display subunit within the superimposed display area. If the malfunctioning light emitting element in the first display subunit is superimposed on a functioning light emitting element in the second display subunit, the operation of the functioning light emitting element is controlled to at least partially compensate for the malfunctioning light emitting element at step 906. In many embodiments, it will be the case that each light emitting element of the first display subunit is designed to emit light of a characteristic wavelength band and is superimposed with a light emitting element of the second display subunit designed to emit light of the same wavelength band. A malfunctioning light emitting element may be a light emitting element that is functioning in a manner deviating from an expected operation. The method of may include operating light emitting elements in the first and second display subunits at respective intermediate power levels between 25% and 75% of an expected emission level if corresponding light emitting elements in both the first display subunit and the second display subunit are functioning. Controlling the operation of the functioning light emitting element to at least partially compensate for the malfunctioning light emitting element may include operating the functioning light emitting element at a level greater than 75% of the expected emission level. In a system such as that depicted in FIG. 15, operating a light emitting element at a selected intermediate power level may be accomplished, for example, by setting gain values in configuration module 828 appropriately for each display element.

Embodiments as described herein may be incorporated into various systems, including, for example, computer systems, television, among others. Basic components of such systems may include a processor, an input device, and a display. A superimposed display, as used in various embodiments, may be a display which includes a first display subunit comprising a first plurality of light emitting elements, of which each light emitting element may be designed to emit light in a characteristic wavelength band, a second display subunit comprising a second plurality of light emitting elements, an optical system configured to optically superimpose each light emitting element of the first plurality with a corresponding light emitting element of the second plurality designed to emit light in the same wavelength band, and electronic circuitry configured to modulate activation of selected light emitting elements in the first plurality to compensate for defects in corresponding light emitting elements in the second plurality.

Figure 17:
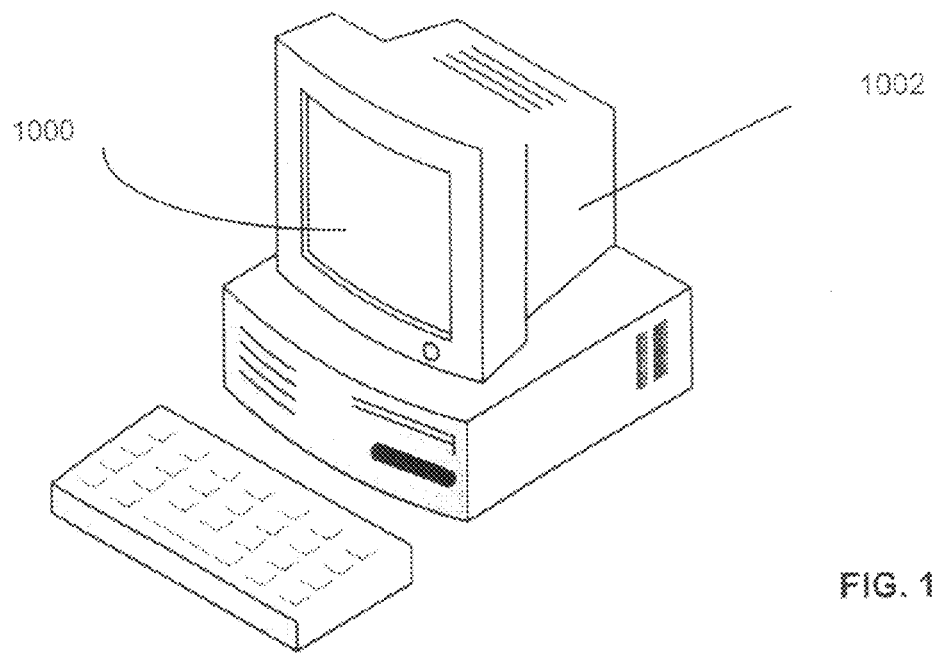
FIG. 17 illustrates application of a superimposed display in a computer system.

If the system is a computer system, for example, the superimposed display may be a computer monitor and the input device may be a computer keyboard, as illustrated in FIG. 17.

Figure 18:
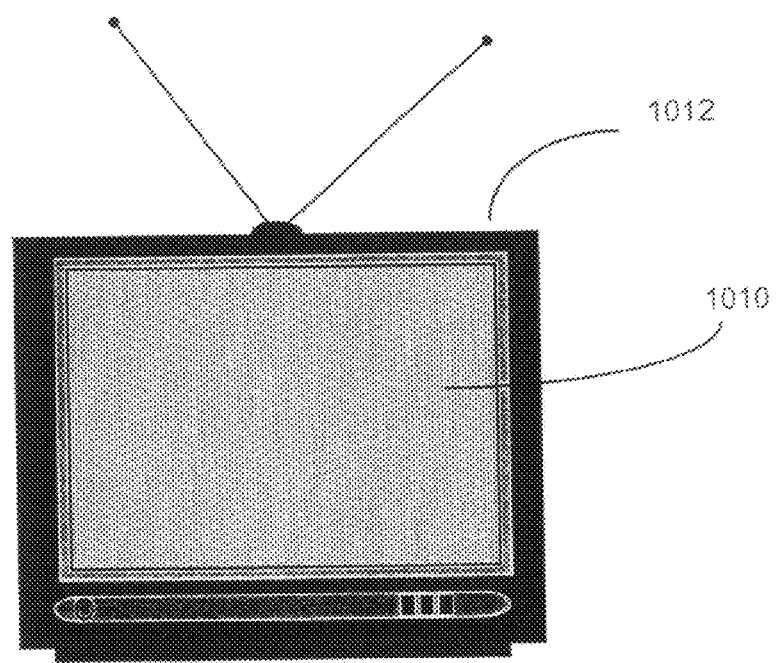
FIG. 18 illustrates application of a superimposed display in a television

FIG. 18 depicts application of a superimposed display 1010 in a television screen 1012. It is increasingly the case that there is little distinction between television screens and computers monitors, as televisions include more interactive capabilities, and television screens include capabilities for displaying images in multiple windows, displaying menu option, and so forth.

Figure 19:
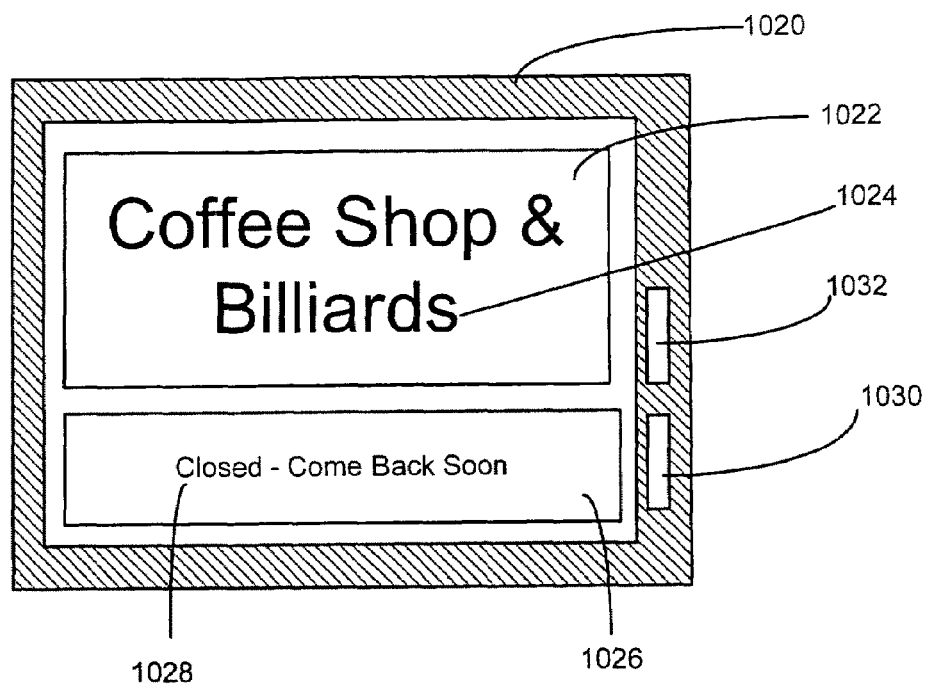
FIG. 19 illustrates application of a superimposed display in a sign.

FIG. 19 illustrates the use of a superimposed display on a sign 1020. Sign 1020 includes a static display portion 1022 that may be configured to display a static image 1024 (in this case, the text "Coffee Shop & Billiards"), and a dynamic display portion 1026 that may be configured to display a message or image 1028 that may be changed at intervals. If desired, the dynamic display portion may display a continuously changing message or image (e.g., scrolling text or animated image). Static display portion 1022 and dynamic display portion 1026 may differ with regard to type and distribution of display elements, or with regard to the control signals used to control the display elements. Signs (and related displays, such as labels, advertisements, billboard, etc., which may also incorporate embodiments of the present invention) may be entirely static, entirely dynamic or mixed-modal, depending on their intended use. Sign 1020 may include battery 1030 and control circuitry 1032 mounted in or on sign 1020 for driving operation of static display portion 1022 and dynamic display portion 1024.

Figure 20:
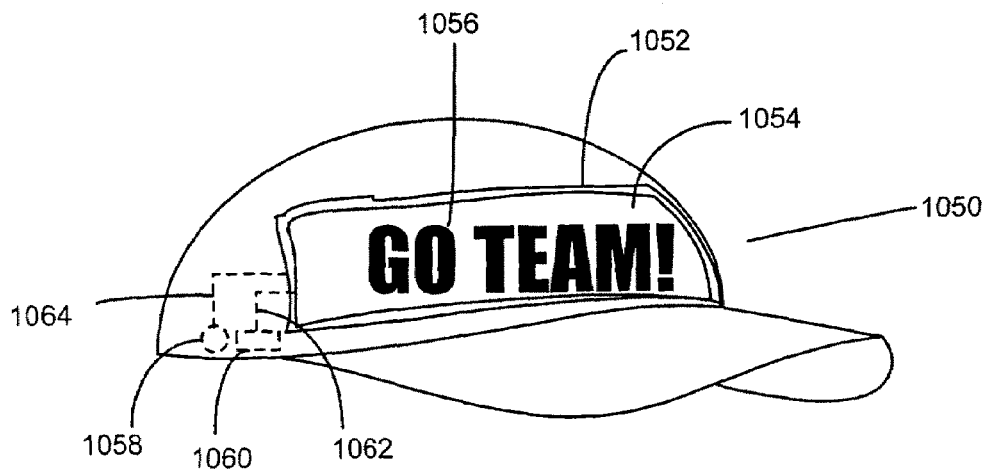
FIG. 20 illustrates application of a superimposed display on a wearable item.

Superimposed displays may also be used on items of apparel, or other decorative or functional items formed of flexible fabric or material. As an example, FIG. 20 illustrates the use of a superimposed display on a baseball cap 1050. Baseball cap 1050 includes panel 1052 containing superimposed display 1054, which may be formed on a flexible substrate. Text, images, or patterns, which may be either static or dynamic, may be displayed on superimposed display 1054. In the example shown in FIG. 20, superimposed display 1054 displays text 1056, reading "GO TEAM!" Superimposed display 1054 may be powered by various methods. As shown in FIG. 20, a small battery 1058 may be mounted on cap 1050 in an inconspicuous location (e.g., in the interior of cap 1050) and connected to superimposed display 1054 via lead 1064. Alternative power supplies may be used instead, e.g., a solar cell. Controller 1060, which may be an ASIC- or a microprocessor-based device, may be mounted on cap 1050 and connected via one or more data-lines 1062 to superimposed display 1054 to drive operation of superimposed display 1054.

Figure 21:
FIG. 21 illustrates application of a superimposed display on a decorative item.

FIG. 21 illustrates the use of a superimposed display on a decorative item having a non-planar substrate: in this example, a vase 1200 bearing a panel 1202 displaying the message "Get Well Soon!". The message "Get Well Soon!" may alternate with one or more other messages or images, may scroll across the panel, may flash, or may produce various other visual effects. Such variations of displays may be applied to any other embodiments in which a dynamic display element array is used, including but not limited to the examples presented herein. Vase 1200 may incorporate a battery or other power supply and control circuitry, as discussed in connection with the baseball cap embodiment depicted in FIG. 20.

Superimposed displays may be used in virtually any setting in which it is desired to graphically display static or dynamic text, images, or patterns on a surface. As discussed previously, dynamic displays may be varied at intervals (for example, dynamic display portion 1026 in FIG. 19 may be changed from "Closed—Come back Soon" to "Open—Come on In"), or may be varied continuously to display scrolling or flashing text, animated graphic, or various other dynamic displays as may be devised by those of skill in the relevant arts. Display elements may be of a wide range of sizes, and superimposed displays may be of a wide range of sizes and resolutions, depending on intended application and construction method and materials. Text, images, and patterns formed through the use of such displays may be informative, decorative, or functional. Such displays may be used in or on a wide variety of decorative and/or functional items, to convey information or to change the appearance of an item in a functional manner (e.g., camouflage or visual signature-reduction on a vehicle or item of clothing), or to present a desired decorative appearance on various items (objects, items of apparel, etc., signs, labels, artwork.)

With regard to the hardware and/or software used in the control of displays according to the present embodiments, and particularly to the control of light generation by display elements within such displays, those having skill in the art will recognize that the state of the art has progressed to the point where there is little distinction left between hardware and software implementations of aspects of such systems; the use of hardware or software is generally (but not always, in that in certain contexts the choice between hardware and software can become significant) a design choice representing cost vs. efficiency or implementation convenience tradeoffs. Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be implicitly understood by those with skill in the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the capabilities of one of skill in the art in light of this disclosure. In addition, those skilled in the art will appreciate that certain mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., links carrying packetized data).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices for displaying or otherwise presenting information in the fashion set forth herein, and thereafter use standard engineering practices to integrate such described devices and/or processes into displays or other light emitting or modulating devices as exemplified herein. That is, at least a portion of the devices and/or processes described herein can be integrated into a display or other light emitting or modulating device containing system via a reasonable amount of experimentation.

Those having skill in the art will recognize that such systems generally include one or more of a memory such as volatile and non-volatile memory, processors such as microprocessors and digital signal processors, computational-supporting or -associated entities such as operating systems, user interfaces, drivers, sensors, actuators, applications programs, one or more interaction devices, such as data ports, control systems including feedback loops and control implementing actuators (e.g., devices for sensing position and/or velocity and/or acceleration or time-rate-of-change thereof; control motors for moving and/or adjusting components and/or quantities). A typical display system may be implemented utilizing any suitable available components, such as those typically found in appropriate computing/communication systems and/or light emitting systems, combined with standard engineering practices.

The foregoing-described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

While particular aspects of the present subject matter described herein have been shown and described, it will be obvious to those skilled in the art that, based upon the teachings herein, changes and modifications may be made without departing from this subject matter described herein and its broader aspects and, therefore, the appended claims are to encompass within their scope all such changes and modifications as are within the true spirit and scope of this subject matter described herein. Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should NOT be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" and/or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense of one having skill in the art would understand the convention (e.g., "a system having at least one of A, B, and C" would include but not be limited to systems that have A alone, B alone, C alone, A and B together, A and C together, B and C together, and/or A, B, and C together). In those instances where a convention analogous to "at least one of A, B, or C, etc." is used, in general such a construction is intended in the sense of one having skill in the art would understand the convention (e.g., "a system having at least one of A, B, or C" would include but not be limited to systems that have A alone, B alone, C alone, A and B together, A and C together, B and C together, and/or A, B, and C together).

Although the methods, devices, systems and approaches herein have been described with reference to certain preferred embodiments, other embodiments are possible. As illustrated by the foregoing examples, various choices of light modulating elements, subunit configuration, and control system may be within the scope of the invention. As has been discussed, the choice of system configuration may depend on the intended application of the system, the environment in which the system is used, cost, personal preference or other factors. Display design, manufacture, and control processes may be modified to take into account choices of display element components and configuration, and such modifications, as known to those of skill in the arts of display design and construction, may fall within the scope of the invention. Therefore, the full spirit or scope of the invention is defined by the appended claims and is not to be limited to the specific embodiments described herein.

The invention claimed is:

1. A display comprising:
   a) a first display subunit comprising a first plurality of light emitting elements, each light emitting element of said first plurality designed to emit light in a characteristic wavelength band;
   b) a second display subunit comprising a second plurality of light emitting elements, each light emitting element of said second plurality designed to emit light in a characteristic wavelength band; and
   c) an optical system configured to optically superimpose each light emitting element of said first plurality with a corresponding light emitting element of said second plurality designed to emit light in a like wavelength band;
   wherein each of said first and second display subunits comprises light emitting elements of at least two types, each type designed to emit light of a respective characteristic wavelength band, and wherein light emitting elements of said first display subunit are optically superimposed with light emitting elements of the same type in said second display subunit.

2. The display of claim 1, wherein each of said first and second display subunits comprises a two-dimensional array of light emitting elements.

3. The display of claim 1, wherein said at least two types of light emitting elements are arranged in like repeating patterns in said first and second display subunits.

4. The display of claim 3, wherein said patterns are spatially periodic.

5. The display of claim 1, wherein said first and second display subunits are in the same substrate.

6. The display of claim 5, wherein said first and second display subunits are in the same layer, level, or surface of said substrate.

7. The display of claim 6, wherein said layer, level, or surface is planar.

8. The display of claim 6, wherein said first and second display subunits are interleaved.

9. The display of claim 6, wherein said first and second display subunits are at least partially overlapping.

10. The display of claim 6, wherein said first and second display subunits are non-overlapping.

11. The display of claim 5, wherein said first and second display subunits are in two different layers, levels, or surfaces of said substrate.

12. The display of claim 11, wherein at least one of said two different layers, levels, or surfaces is planar.

13. The display of claim 1, wherein said optical system includes one or more lenses, lenslets, reflectors, diffractive elements, combiners, polarization selective elements, or waveguides.

14. A method of producing a display, comprising:
a) superimposing first and second display subunits having substantially identical arrangements of light modulating elements to form a superimposed display area, wherein each light modulating element of said first display subunit is designed to modulate light in a respective characteristic pattern, and wherein each light modulating element of said first display subunit within said superimposed display area is superimposed with a light modulating element of said second display subunit designed to modulate light of a like characteristic pattern;
b) controlling said first display subunit to produce a first light pattern; and
c) controlling said second display subunit to produce a second light pattern that when superimposed with said first light pattern produces a desired light pattern in said superimposed display area;
wherein said first display subunit comprises two or more subsets of light modulating elements, each said subset designed to modulate light in a respective wavelength band, wherein each said respective wavelength band is different from the respective wavelength band of at least one other subset of light modulating elements.

15. The method of claim 14, comprising detecting said first light pattern and adjusting said second light pattern responsive to said detected first light pattern to compensate for differences between said first light pattern and said desired light pattern.

16. The method of claim 14, wherein said first display subunit comprises a first subset of light modulating elements designed to emit light in a red wavelength band, a second subset of light modulating elements designed to emit light in a green wavelength band, and a third subset of light modulating elements designed to emit light in a blue wavelength band.

17. The method of claim 14, wherein detecting said first light pattern includes detecting said light pattern optically.

18. The method of claim 14, wherein detecting said first light pattern includes detecting an electrical correlate of said light pattern.

19. The method of claim 14, wherein light modulating elements of said two or more subsets are arranged in a repeating pattern according to the light modulation wavelength band of said light modulating elements.

20. The method of claim 14, wherein said first and second display subunits are controlled to simultaneously produce substantially identical first and second light patterns within said superimposed display area.

* * * * *